(12) United States Patent
Hsu et al.

(10) Patent No.: US 12,713,560 B2
(45) **Date of Patent: *Aug. 18, 2026**

(54) HEAT SINK STRUCTURE AND METHODS THEREOF

(71) Applicant: Taiwan Semiconductor Manufacturing Company, Ltd., Hsinchu (TW)

(72) Inventors: Chien Hao Hsu, Hsinchu County (TW); Kuo-Chin Chang, Chiayi City (TW); Kathy Wei Yan, Hsinchu (TW); Jun He, Hsinchu County (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 19/278,363

(22) Filed: Jul. 23, 2025

(65) Prior Publication Data

US 2025/0351303 A1 Nov. 13, 2025

Related U.S. Application Data

(63) Continuation of application No. 18/659,546, filed on May 9, 2024.

(Continued)

(51) Int. Cl.
*H05K 7/20* (2006.01)

(52) U.S. Cl.
CPC ..... *H05K 7/20336* (2013.01); *H05K 7/20154* (2013.01)

(58) Field of Classification Search
CPC ... H10W 40/47; H10W 40/73; H10W 40/475; F28F 3/12; F28F 2260/02; F28F 13/06;

(Continued)

(56) References Cited

U.S. PATENT DOCUMENTS 6,903,929 B2 6/2005 Prasher
7,115,987 B2 10/2006 Holalkere (Continued)

FOREIGN PATENT DOCUMENTS

CN 1669905 A 9/2005
JP 2016517566 A 6/2016

(Continued)

OTHER PUBLICATIONS

Fylladitakis, Emmanouil D, et al., "Review on the History, Research, and Applications of Electrohyrodynamics", IEEE Transactions on Plasma Science, vol. 42, No. 2, Feb. 2014, 18pp.

(Continued)

*Primary Examiner* — Mandeep S Buttar
(74) *Attorney, Agent, or Firm* — HAYNES AND BOONE, LLP

(57) ABSTRACT

One aspect of the present disclosure pertains to an integrated circuit (IC) structure. The IC structure includes a die and an integrated heat sink structure disposed over the die. In some embodiments, the integrated heat sink structure includes a first closed-loop microchannel structure adjacent to the die and a second closed-loop microchannel structure disposed over the first closed-loop microchannel structure. In an example, the second closed-loop microchannel structure is disposed further away from the die than the first closed-loop microchannel structure. In some implementations, a plurality of microchannels and a micromixer chamber collectively provide the first and second closed-loop microchannel structures.

20 Claims, 15 Drawing Sheets

Related U.S. Application Data

(60) Provisional application No. 63/617,660, filed on Jan. 4, 2024.

(58) Field of Classification Search
CPC .... F28F 2215/06; F28F 2250/08; F28F 27/02; F28F 9/026; H05K 7/20254; H05K 7/20154; H05K 7/20272; H05K 7/20281; H05K 7/20309; H05K 7/20327; H05K 7/20927; H05K 7/20936; F28D 15/0266; F28D 1/035; F28D 15/00; F28D 2021/0029; F28D 2021/0028; G06F 2200/201; G06F 1/20
See application file for complete search history.

(56) References Cited

U.S. PATENT DOCUMENTS

| | | | | |
|---|---|---|---|---|
| 7,460,369 | B1 * | 12/2008 | Blish, II | F28F 7/02 174/15.1 |
| 10,317,962 | B2 | 6/2019 | Bose | |
| 2004/0104012 | A1 | 6/2004 | Zhou | |
| 2004/0190252 | A1 | 9/2004 | Prasher | |
| 2006/0131003 | A1 * | 6/2006 | Chang | F28D 15/0266 165/104.33 |
| 2007/0020124 | A1 | 1/2007 | Singhal | |
| 2008/0006389 | A1 * | 1/2008 | Sauciuc | F28D 15/00 257/714 |
| 2008/0190586 | A1 * | 8/2008 | Robinson | H10W 40/475 361/689 |
| 2010/0171213 | A1 | 7/2010 | Hisano | |
| 2017/0133298 | A1 * | 5/2017 | Gutala | H10W 40/47 |
| 2018/0158756 | A1 * | 6/2018 | Smoot | H10W 40/73 |
| 2018/0269090 | A1 | 9/2018 | Kobayashi | |
| 2021/0410328 | A1 * | 12/2021 | Yang | H05K 7/20254 |
| 2024/0282669 | A1 * | 8/2024 | Mohamed | H10W 40/47 |

FOREIGN PATENT DOCUMENTS

| | | | |
|---|---|---|---|
| KR | 20150136597 | A | 12/2015 |
| KR | 101862003 | B1 | 5/2018 |
| TW | 200620603 | A | 6/2006 |
| TW | 201709444 | A | 3/2017 |

OTHER PUBLICATIONS

Yunlong, Qiu, et al., “An Experimental Study of Microchannel and Micro-Pin-Fin Based On-Chip Cooling Systems with Silicon-to-Silicon Direct Bonding”, Sensors 2020, 20, 5533; doi:10.3390/s20195533.

Akhtar, Syed Sohail, “An Integrated Approach to Design and Develop High-Performance Polymer-Composite Thermal Interface Material”, Polymers 2021, 13, 807. https://doi.org/10.3390/polym13050807.

Yuan, Zihao et al., “Neural network-based cooling design for high-performance processors”, iScience 25, 103582, Jan. 21, 2022, 15pp.

Rangarajan, Srikanth, et al., “A Review of Recent Developments in “On-Chip” Embedded Cooling Technologies for Heterogeneous Integrated Applications”, Elsevier Research Electrical Engineering Review; Engineering 26 (2023) 185-197.

Peng, Yanhong, et al., A Review on Electrohydrodynamic (EHD) Pump, doi: 10.20944/preprints202301.0320.v1.

Won, Yonghyun, et al., “Study of On-chip Liquid Cooling in Relation to Micro-channel Design”, J. Microelectron. Packag. Soc., 22(4), 31-36 (2015), http://dx.doi.org/10.6117/kmeps.2015.22.4.031.

Wang, Tao, et al., “A Comprehensive Study of a Micro-Channel Heat Sink Using Integrated Thin-Film Temperature Sensors”, Sensors 2018, 18, 299; doi: 10.3390/s18010299.

* cited by examiner

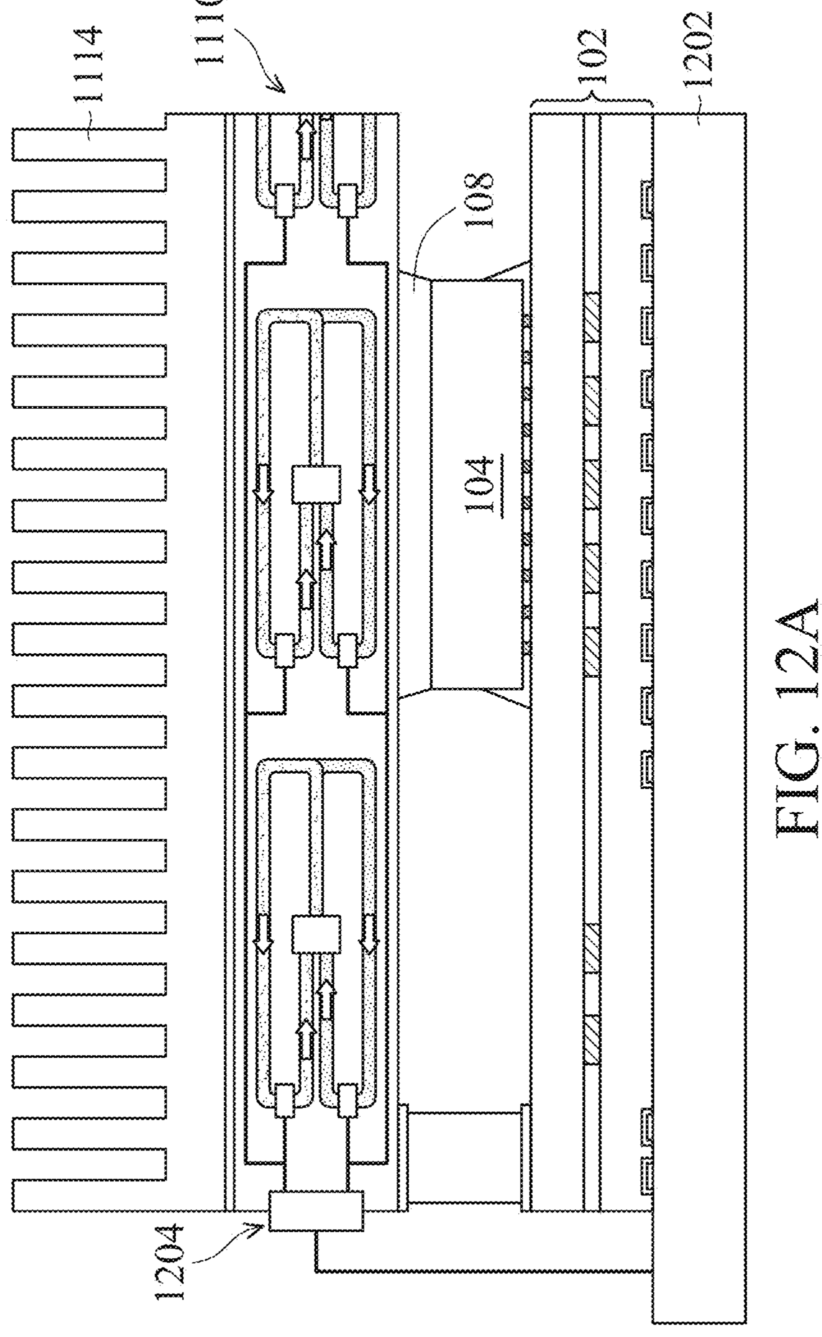
FIG. 12A
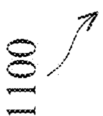

1300

HEAT SINK STRUCTURE AND METHODS THEREOF

PRIORITY DATA

This application is a continuation of U.S. patent application Ser. No. 18/659,546, filed May 9, 2024, which claims the benefit of U.S. Provisional Application No. 63/617,660, filed Jan. 4, 2024, the entireties of which are herein incorporated by reference.

BACKGROUND

The electronics industry has experienced an ever-increasing demand for smaller and faster electronic devices that are simultaneously able to support a greater number of increasingly complex and sophisticated functions. To meet these demands, there is a continuing trend in the integrated circuit (IC) industry to manufacture low-cost, high-performance, and low-power ICs. Thus far, these goals have been achieved in large part by reducing IC dimensions (for example, minimum IC feature size), thereby improving production efficiency and lowering associated costs. However, such scaling has also increased complexity of the IC manufacturing processes. Thus, realizing continued advances in IC devices and their performance requires similar advances in IC manufacturing processes and technology.

In particular, while the downscaling of IC dimensions has continued to boost device performance, the increasing device density also increases power density, which in turn has caused IC thermal management to become a key challenge in the development of semiconductor technology. In some examples, advanced IC devices can produce high heat fluxes, with localized hot spots, which will degrade device performance and reliability. While various solutions to provide cooling for high performance devices have been explored, thus far their thermal exchange efficiency has been limited.

Thus, existing techniques have not proved entirely satisfactory in all respects.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion. It is also emphasized that the figures appended illustrate only typical embodiments of this invention and are therefore not to be considered limiting in scope, for the invention may apply equally well to other embodiments. Further, the accompanying figures may implicitly describe features not explicitly described in the detailed description.

FIGS. 12A and 12B illustrate portions of an IC cooling assembly of FIG. 11 further showing additional features of the IC cooling assembly, according to some embodiments.

DETAILED DESCRIPTION

Figure 1:
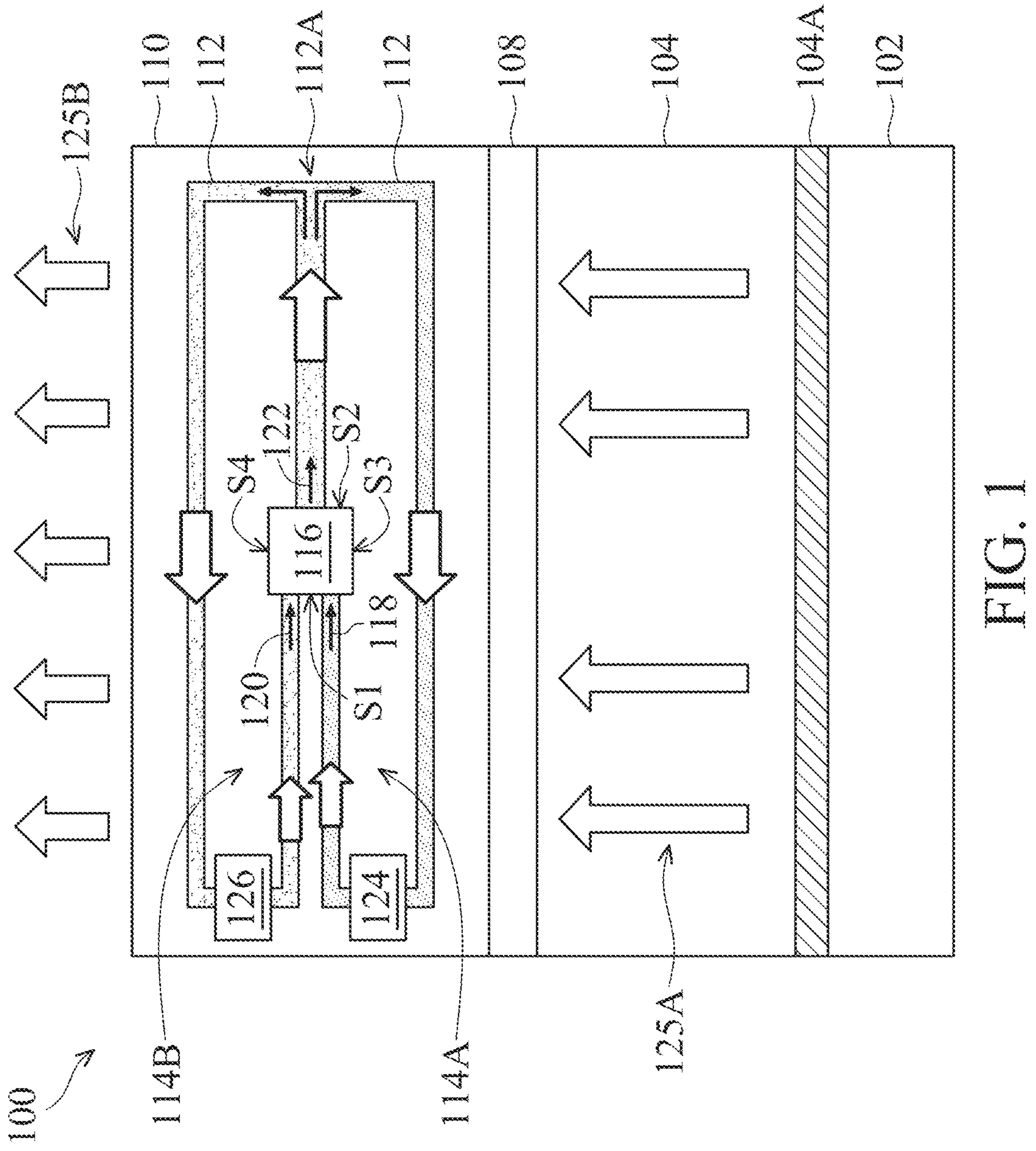
FIG. 1 illustrates a cross-section view of an IC structure including an integrated heat sink (IHS) structure, according to some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. It is also noted that in the discussion that follows, the terms "liquid" and "fluid" may at times be used interchangeably, and use of such terms is not meant to be limiting in any way. Moreover, while the various embodiments disclosed herein are largely discussed with reference to a liquid (e.g., such as water or a magnetic fluid), in at least some embodiments, the liquids or fluids referred to herein may includes one or more gases.

Further, when a number or a range of numbers is described with "about," "approximate," and the like, the term is intended to encompass numbers that are within a reasonable range considering variations that inherently arise during manufacturing as understood by one of ordinary skill in the art. For example, the number or range of numbers encompasses a reasonable range including the number described, such as within +/−10% of the number described, based on known manufacturing tolerances associated with manufacturing a feature having a characteristic associated with the number. For example, a material layer having a thickness of "about 5 nm" can encompass a dimension range from 4.25 nm to 5.75 nm where manufacturing tolerances associated with depositing the material layer are known to be +1-15% by one of ordinary skill in the art. Further, disclosed dimensions of the different features can implicitly disclose dimension ratios between the different features. Still further, the present disclosure may repeat reference numerals and/or letters in the various examples. This repetition is for the purpose of simplicity and clarity and does not in itself dictate a relationship between the various embodiments and/or configurations discussed.

To meet the continued demands of delivering advanced integrated circuit (IC) devices and circuits, IC dimensions (e.g., minimum IC feature size) have continued to be scaled down. Downscaling of IC dimensions has boosted device performance and increased device density. However, the increased device density has also increased power density, which in turn has caused IC thermal management to become a key challenge in the development of semiconductor technology. In some examples, advanced IC devices can produce high heat fluxes, with localized hot spots, which will degrade device performance and reliability. As one potential solution, some existing implementations employ embedded microchannels as part of an integrated heat sink (IHS) (e.g., disposed on a die or die package) as an efficient method to enhance the thermal exchange efficiency of the IHS. For example, single closed loop microchannels may be used as part of the IHS. However, such microchannels will suffer from high flow resistance with microchannel length and increasing complexity, and thus have limited thermal exchange efficiency. To overcome the high flow resistance, more electrical power may be needed to push a liquid coolant through the microchannel. As a result, the length and/or design of the microchannel is limited. While single closed loop microchannels embedded as part of an IHS, as well as other solutions, have been explored to provide cooling for advanced and high performance IC devices, overall, their thermal exchange efficiency has been limited. Thus, existing techniques have not proved entirely satisfactory in all respects.

Embodiments of the present disclosure offer advantages over the existing art, though it is understood that other embodiments may offer different advantages, not all advantages are necessarily discussed herein, and no particular advantage is required for all embodiments. For example, embodiments discussed herein include an integrated heat sink structure, and related methods, that support thermal cooling of IC dies and packages and that effectively serve to overcome various shortcomings of existing methods. In some embodiments, the integrated heat sink (IHS) structure includes a plurality of closed loop microchannels coupled to a hybrid active-passive micromixer chamber to increase thermal exchange efficiency of the IHS structure for high performance computing package products.

In various examples, the IHS structure is disposed over a die or die package, with a thermal interface material (TIM) layer disposed between the IHS structure and the die or die package. In some cases, the IHS structure may include a first microchannel adjacent to the die or die package and a second microchannel disposed over the first microchannel, the second microchannel being further away from the die or die package than the first microchannel. In various embodiments, a micromixer chamber is fluidly coupled to the first and second microchannels via respective inlets and an outlet. In some embodiments, the first and second microchannels may provide two closed loop microchannels, together with the micromixer chamber, to enhance thermal exchange efficiency.

The inlets for the first and second microchannels may be coupled to pumps, which may be controlled using an active oscillate input phase (OIP) control. In various embodiments, the OIP control provides for control of a liquid injected into the micromixer chamber (e.g., by controlling liquid velocity and phase (in time)). Generally, the active OIP control may be used to adjust and/or enhance the thermal exchange efficiency. For example, the OIP control of the liquid injected into the inlets may control respective amounts of and/or respective velocities of injected liquids (of various temperatures) into the micromixer chamber via respective microchannels, to further enhance the thermal exchange efficiency of the IHS structure.

In accordance with various embodiments, the micromixer chamber and microchannel inlets may have various designs, each of which may provide a different thermal exchange efficiency to accommodate different heat sinks, different die, or different die packages. In some embodiments, the liquid used as a coolant in the IHS structure may include water and/or a magnetic fluid, as described in more detail below. Regardless of the particular design of the IHS structure, embodiments of the present disclosure provide for improved thermal cooling of IC dies and packages, thereby directly addressing the IC thermal management challenge associated with advanced IC circuits and devices. Additional details of embodiments of the present disclosure are provided below, and additional benefits and/or other advantages will become apparent to those skilled in the art having benefit of the present disclosure.

FIG. 1 illustrates a cross-section view of a semiconductor or IC structure 100 including a substrate 102, a die 104 and an integrated heat sink (IHS) structure 110. The die 104 may include logic devices including high-power devices such as high-power logic devices, memory devices, and/or devices including other functionality. The IC structure 100 may be an IC package mounted onto a printed circuit board (PCB). In other embodiments, the substrate 102 may include a PCB, a package substrate, a semiconductor substrate, an interposer, a dielectric substrate and/or other supportive feature. In some implementations, the substrate 102 may include conductive traces connecting to the overlying die 104. In some implementations, the substrate 102 may include input/output terminals such as bumps, balls, or pillars (e.g., for providing electrical connections to an underlying PCB). Further, in some examples, the die 104 may include input/output terminals such as bumps, balls, or pillars for providing electrical connections to the underlying substrate 102 (e.g., using a flip-chip process).

In some implementations, the IHS structure 110 is coupled to the die 104 using an interposing thermal interface material (TIM) layer 108 to enhance heat transfer therebetween. The TIM layer 108 may include a variety of different types of materials such as thermal gels, thermal grease, graphite, diamond, silver, aluminum nitride, boron nitride, alumina, silicon nitride, silicon carbide, ceramics, metals, and/or other thermally conductive materials or combinations thereof. In some implementations, such as described below with reference to FIG. 11, an external heat sink may be disposed over and attached to the IHS structure 110 by way of another TIM layer.

The IHS structure 110, in various embodiments, includes a plurality of microchannels 112 and a micromixer chamber 116, that together provide a first closed-loop microchannel structure 114A and a second closed-loop microchannel structure 114B, through which a liquid coolant is configured to flow. In an example, the first closed-loop microchannel structure 114A and the second closed-loop microchannel structure 114B are fluidly coupled to the micromixer chamber 116 by a first inlet 118 and a second inlet 120, respectively. In addition, the first closed-loop microchannel structure 114A and the second closed-loop microchannel structure 114B are fluidly coupled to the micromixer chamber 116 by an outlet 122. Thus, the micromixer chamber 116, in the present example, has two inlets 118, 120 and a single (or common) outlet 122.

In some examples, the micromixer chamber 116 has a substantially square or rectangular shape (in a cross-section view), as shown, having a first side S1, a second side S2 opposite the first side S1 and parallel to the first side S1, a third side S3, and a fourth side S4 opposite the third side S3 and parallel to the third side S3. The first and second sides S1, S2 are also perpendicular to the third and fourth sides S3, S4. It will be understood however, that the shape of the micromixer chamber 116 is not limited to the examples shown, and in some embodiments, the micromixer chamber 116 may have other shapes in a cross-section view such as circular, oval, elliptical, triangular, trapezoidal, hexagonal, pentagonal, other polygon shape, other shapes in a three-dimensional view such as cubic, spherical, cuboid, conical, cylindrical, pyramidal, prism, or other suitable shape. In the illustrated example, the first and second inlets 118, 120 are both fluidly coupled to the same side (the first side S1) of the micromixer chamber 116, and the first inlet 118 and the second inlet 120 are oriented parallel to each other and perpendicular to a plane defined by the first side S1 of the micromixer chamber 116. The outlet 122, as shown, is fluidly coupled to a central portion of the second side S2 of the micromixer chamber 116 opposite the first side S1, and the outlet 122 is oriented perpendicular to a plane defined by the second side S2 of the micromixer chamber 116.

In the illustrated embodiment, the first closed-loop microchannel structure 114A is disposed adjacent to (e.g., nearer to) the underlying die 104, while the second closed-loop microchannel structure 114B is disposed over the first closed-loop microchannel structure 114A. The second closed-loop microchannel structure 114B is thus disposed further away from the die 104 than the first closed-loop microchannel structure 114A. In some embodiments, a ratio of the widths of the micromixer chamber 116 and the microchannels 112 may be in a range of between about 5:1 to about 15:1. In some cases, the width of the microchannels 112 at each of the first and second inlets 118, 120 may be the same or different. In some embodiments, the ratio of the width and length of the micromixer chamber 116 may be in a range of between about 1:1 to about 1:5. If the micromixer chamber 116 is too thin (or too narrow), the thermal exchange efficiency of the IHS structure 110 may be worse.

In various implementations, the IHS structure 110 further includes a first pump 124 coupled in-line with the microchannel 112 of the first closed-loop microchannel structure 114A, and a second pump 126 coupled in-line with the microchannel 112 of the second closed-loop microchannel structure 114B. Stated another way, the first pump 124 is coupled to the first inlet 118 of the first closed-loop microchannel structure 114A, and the second pump 126 is coupled to the second inlet 120 of the second closed-loop microchannel structure 114B. In some embodiments, the first pump 124 is used to control the liquid injected into the micromixer chamber 116 via the first inlet 118, and the second pump 126 is used to control the liquid injected into the micromixer chamber 116 via the second inlet 120. In some examples, liquid is injected into the micromixer chamber 116 at different times via each of the first and second inlets 118, 120. However, in at least some cases, liquid may be injected into the micromixer chamber 116 via each of the first and second inlets 118, 120 at the same time or at partially overlapping times. As described in more detail below, each of the first and second pumps 124, 126 is coupled to and controlled using a controller such as an active oscillate input phase (OIP) controller, which may provide for control of a velocity, amount, and phase of the liquid injected into the micromixer chamber 116 via respective ones of the first and second inlets 118, 120.

During operation, heat 125A generated by the die 104 will primarily come from a device layer 104A of the die 104, where heat-generating devices are disposed (e.g., such as transistors used to provide logic devices including high-power devices, memory devices, and/or other devices). The heat 125A generated by the die 104 may be transferred (e.g., by conduction) through the die 104 up to the IHS structure 110. The IHS structure 110, in turn, will transfer heat 125B away from the IHS structure 110 (e.g., by convection). More particularly, liquid flowing through the first closed-loop microchannel structure 114A may receive a transfer of a substantial portion of the heat 125A from the die 104, as the liquid travels adjacent to the die 104 through the microchannel 112 of the first closed-loop microchannel structure 114A. Thus, the liquid entering the micromixer chamber 116 via the first inlet 118 may be hotter than liquid entering the micromixer chamber 116 via the second inlet 120. As such, the first inlet 118 may be referred to as a hot inlet, and the second inlet 120 may be referred to as a cold inlet. In some embodiments, the temperature of the liquid at the first inlet 118 (hot inlet) may be in a range of between about 80-100 degrees Celsius, the temperature of the liquid at the second inlet 120 (cold inlet) may be in a range of between about 25-40 degrees Celsius, and thus the temperature difference between the first and second inlets 118, 120 (hot and cold inlets) may be in a range of between about 40-75 degrees Celsius. The micromixer chamber 116, including the hot and cold inlets (first and second inlets 118, 120), provides for mixing of the hot/cold liquids entering the hot/cold inlets, resulting in enhanced thermal exchange at the outlet 122. In some embodiments, the temperature difference between the first inlet 118 (hot inlet) and the outlet 122 may be in a range of between about 15-30 degrees Celsius. The liquid flowing from the outlet 122 will be divided at a microchannel junction 112A, where a first part of the liquid proceeds through the first closed-loop microchannel structure 114A and a second part of the liquid proceeds through the second closed-loop microchannel structure 114B. In some cases, the heat 125B may largely transfer away from the IHS structure 110 via the microchannel 112 of the second closed-loop microchannel structure 114B as the liquid travels adjacent to a top surface of the IHS structure 110, thereby ensuring that the liquid entering the micromixer chamber 116 via the second inlet 120 remains cooler than the liquid entering the micromixer chamber 116 via the first inlet 118.

Figures 2A, 2B:
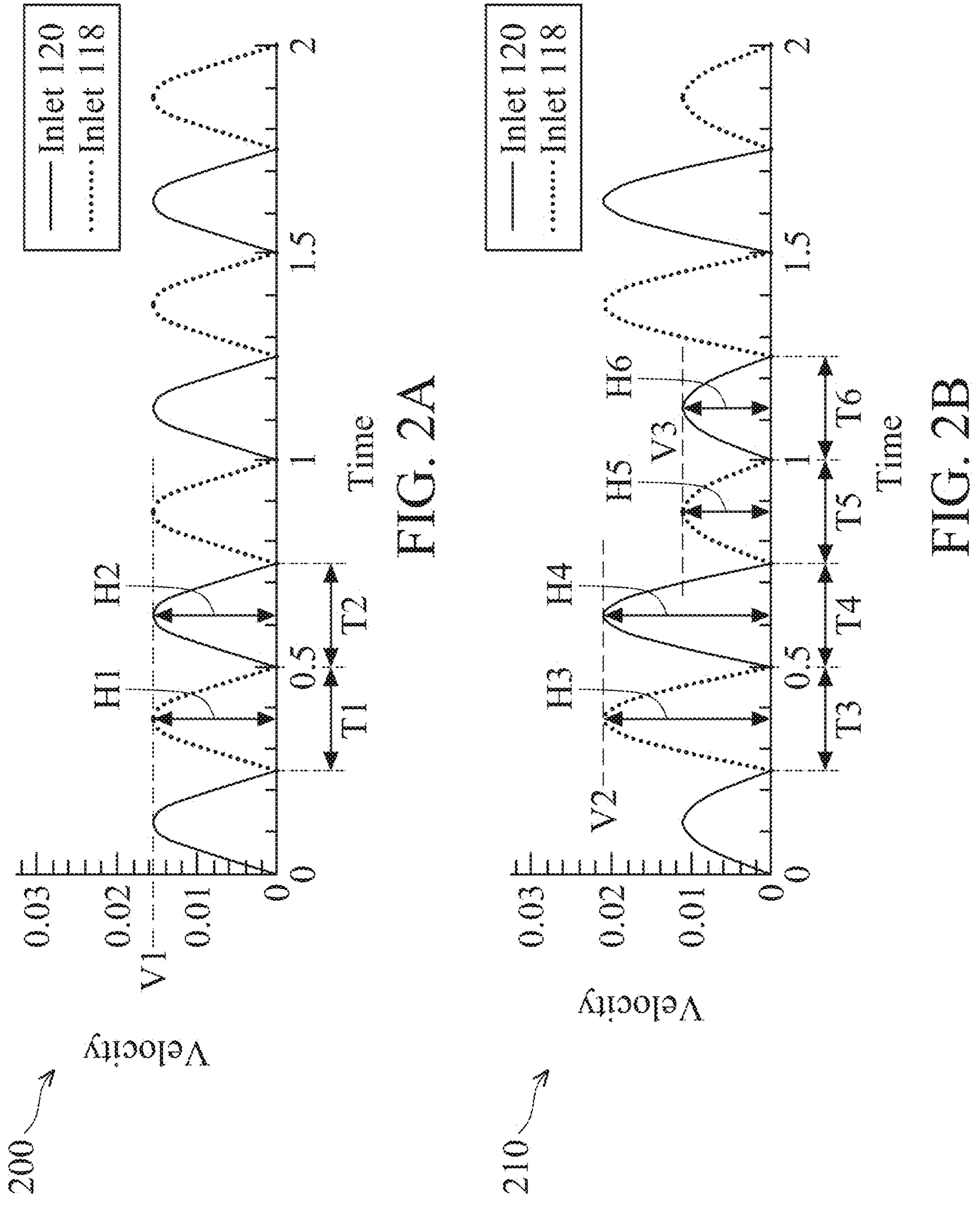
FIGS. 2A and 2B illustrate exemplary velocity-time graphs showing control pulses corresponding to a liquid injected via each of first and second inlets of the IHS structure, according to some embodiments.

Returning to the OIP controller used to control the first and second pumps 124, 126, and with reference to FIGS. 2A and 2B, illustrated therein are exemplary velocity-time graphs 200, 210 showing control pulses corresponding to a liquid injected via each of the first and second inlets 118, 120. In the graph 200 of FIG. 2A, and as indicated by the control pulses for each of the first and second inlets 118, 120, the liquid is injected via each of the first and second inlets 118, 120 at substantially the same velocity (V1) while being phase shifted (in time) from each other so that only one of the first and second inlets 118, 120 is injecting liquid into the micromixer chamber 116 at any given time. In some alternative embodiments, liquid may be injected into the micromixer chamber 116 via each of the first and second inlets 118, 120 at the same time (e.g., control pulses in the graph 200 for inlets 118, 120 fully overlapping or in phase with each other) or at partially overlapping times (e.g., control pulses in the graph 200 for inlets 118, 120 partially overlapping or partially phase shifted in time). In the graph 210 of FIG. 2B, the liquid is injected via each of the first and second inlets 118, 120 in accordance with varying pairs of control pulses having matching velocities while being phase shifted (in time) from each other so that only one of the first and second inlets 118, 120 is injecting liquid into the micromixer chamber 116 at any given time. For example, as shown in the graph 210 and as indicated by the control pulses for each of the first and second inlets 118, 120, the liquid may be injected via each of the first and second inlets 118, 120 in sequence (one after the other) at a same first velocity (V2) for each of the first and second inlets 118, 120. Thereafter, the liquid may be injected via each of the first and second inlets 118, 120 in sequence at a same second velocity (V3) for each of the first and second inlets 118, 120, where the second velocity is different than the first velocity. While some examples of controlling the first and second pumps 124, 126 using the OIP controller (e.g., via control pulses corresponding to a liquid injected via each of the first and second inlets 118, 120) have been given, it will be understood that other embodiments are equally possible. For instance, in some cases, the liquid injected via the first inlet 118 may generally have a different velocity than the liquid injected via the second inlet 120. In other cases, different amounts of liquid may be injected via each of the first and second inlets 118, 120 (e.g., the control pulses corresponding to each of the inlets 118, 120 may have different widths, as opposed to substantially similar widths and similar amounts of liquid injected, as presently shown). By providing control of the first and second pumps 124, 126 by way of the OIP controller, and thus control of the liquid injected into the micromixer chamber 116 via each of the first and second inlets 118, 120, the thermal exchange efficiency of the IHS structure 110 will be enhanced.

Figure 3:
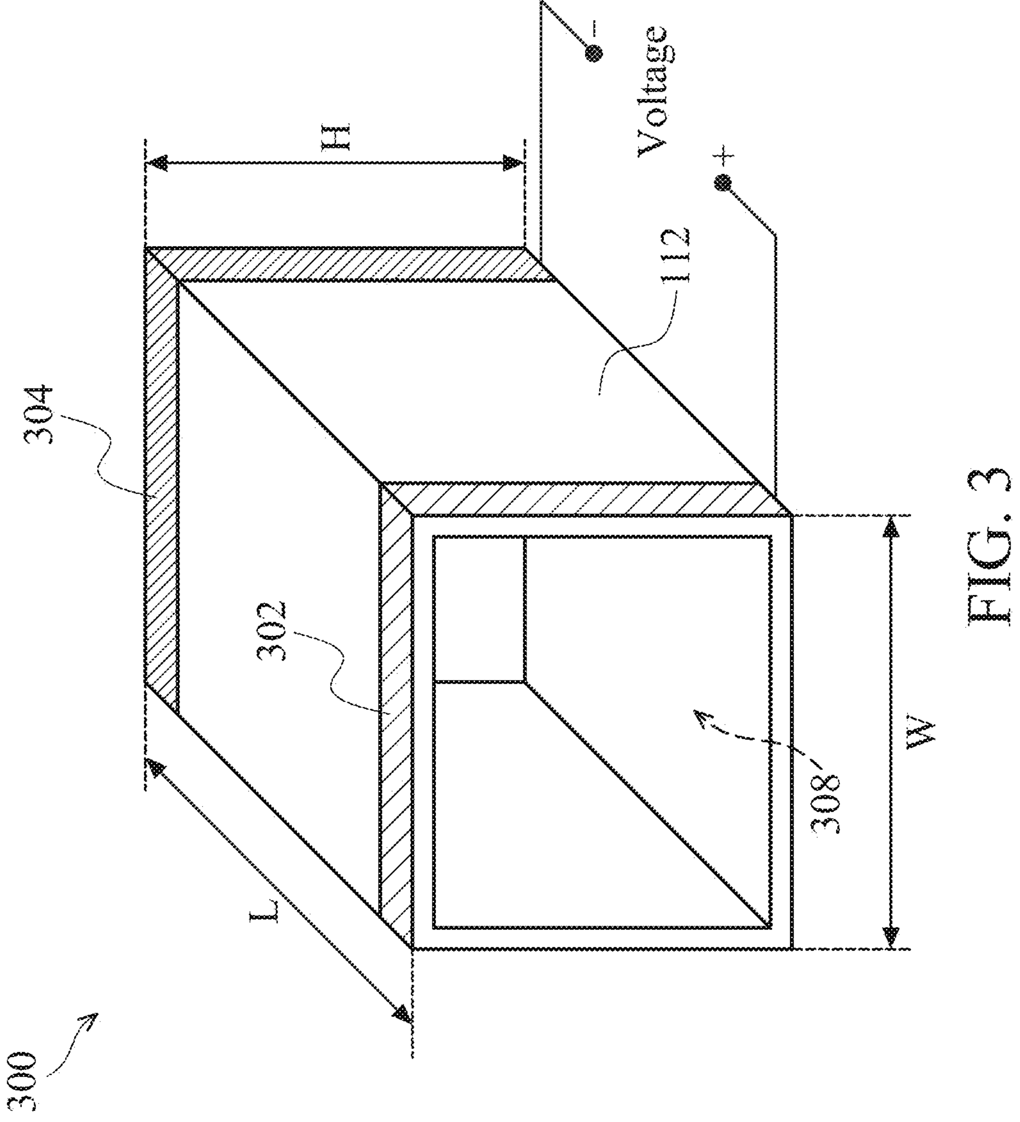
FIG. 3 illustrates an exemplary electro-hydrodynamic (EHD) pump, according to some embodiments.

As discussed above, the IHS structure 110 includes the first pump 124 coupled to the first inlet 118 and the second pump 126 coupled to the second inlet 120. In some embodiments, the first and second pumps 124, 126 may be implemented using an internal or an external pump such as an electromechanical (e.g., MEMS-based) pump, an electrokinetic pump (EK pump), or a micropump. In some embodiments, the first and second pumps 124, 126 may be implemented using an electro-hydrodynamic (EHD) pump to drive the liquid through the microchannels 112 and into respective ones of the first and second inlets 118, 120. With reference to FIG. 3, illustrated therein is an exemplary EHD pump 300. In some embodiments, the EHD pump 300 is implemented within a portion of the microchannels 112. Thus, in some cases, a geometry (e.g., length 'L', width 'W', and height 'H') of the EHD pump 300 may be substantially the same as the geometry of the microchannels 112. To be sure, in some cases, the EHD pump 300 may have a different geometry than the microchannel 112 to which it is coupled to in-line (e.g., where at least one of the length, depth, and width between the EHD pump 300 and in-line coupled microchannel 112 is different).

As shown, the EHD pump 300 includes an emitter 302 and a collector 304, between which a voltage is applied. The flow and pressure of a liquid 308 (e.g., including a velocity, an amount, and a phase of the liquid 308) flowing through the EHD pump 300 may be controlled by the applied voltage (e.g., flow and pressure increase with increasing voltage). In some examples, a body of the EHD pump 300, which may include portions of the microchannels 112, may include silicon, glass, or other semiconductor material or dielectric material. Thus, in some implementations, the IHS structure 110 itself may be composed of silicon, glass, another semiconductor material or dielectric material, or combinations thereof. In an example, the emitter 302 and collector 304 may include copper, silver, gold, tungsten, nickel, aluminum, or other appropriate conductive material. In some alternative implementations where the EHD pump 300 is not embedded within the IHS structure 110, and for example where an external pump is used, the IHS structure 110 may be composed of copper or other high thermal conductivity material. To be sure, in some cases, the IHS structure 110 may be composed of copper and may still include the embedded EHD pump 300, for instance by providing a protective insulation layer around the EHD pump 300 that isolates the EHD pump 300 (and the emitter 302 and the collector 304) from a surrounding copper structure.

In some embodiments, the liquid 308 used as a coolant in the IHS structure 110, and thus in the EHD pump 300, may include water, a magnetic fluid, a dielectric fluid, or other appropriate fluid. In some cases, if the microchannels 112 are very thin or narrow, for instance such that one or more of the length 'L', width 'W', and height 'H' of the microchannels 112 is less than about 100 microns, then the liquid used in the microchannels 112 may be polarized and exhibit magnetic properties even when the coolant used is not a magnetic fluid. For example, water used as the coolant in microchannels 112 having dimensions less than about 100 microns may become polarized and exhibit magnetic properties. As a result, an EHD pump (e.g., implemented as one or both of the first and second pumps 124, 126) may drive the polarized liquid through the microchannels 112 in response to an applied voltage. In alternative embodiments, the coolant used in the IHS structure 110 may be a magnetic fluid. By way of example, such a magnetic fluid may include iron oxide ($Fe_3O_4$), which may be suspended in one or more organic solvents. By using such a magnetic fluid or magnetic nanoparticles suspended in an organic solvent, the dimensions of the microchannels 112 may be greater than 100 microns in some cases, with the magnetic fluid still being strongly polarized and able to be driven by an EHD pump (e.g., implemented as one or both of the first and second pumps 124, 126). In some embodiments, a suitable surfactant may be added to cover the magnetic nanoparticles. In various cases, use of microchannels 112 with larger dimensions and corresponding use of a magnetic fluid may provide for enhanced thermal exchange efficiency and may be easier to manufacture.

With reference now to FIGS. 4-10, illustrated therein are cross-section views of a semiconductor or IC structure, similar to the semiconductor or IC structure 100 of FIG. 1, but providing exemplary alternative designs of the IHS structure 110. In particular, the various designs of the IHS structure 110 may include various designs of the plurality of microchannels 112, the micromixer chamber 116, the closed-loop microchannel structures, and/or the inlets and outlet of the micromixer chamber 116, where each of the various designs may provide a different thermal exchange efficiency to accommodate different heat sinks, different die, or different die packages. Thus, in some cases, the various designs shown and described herein may be used to accommodate different types of heat-generating devices generating different amounts of heat.

Figure 4:
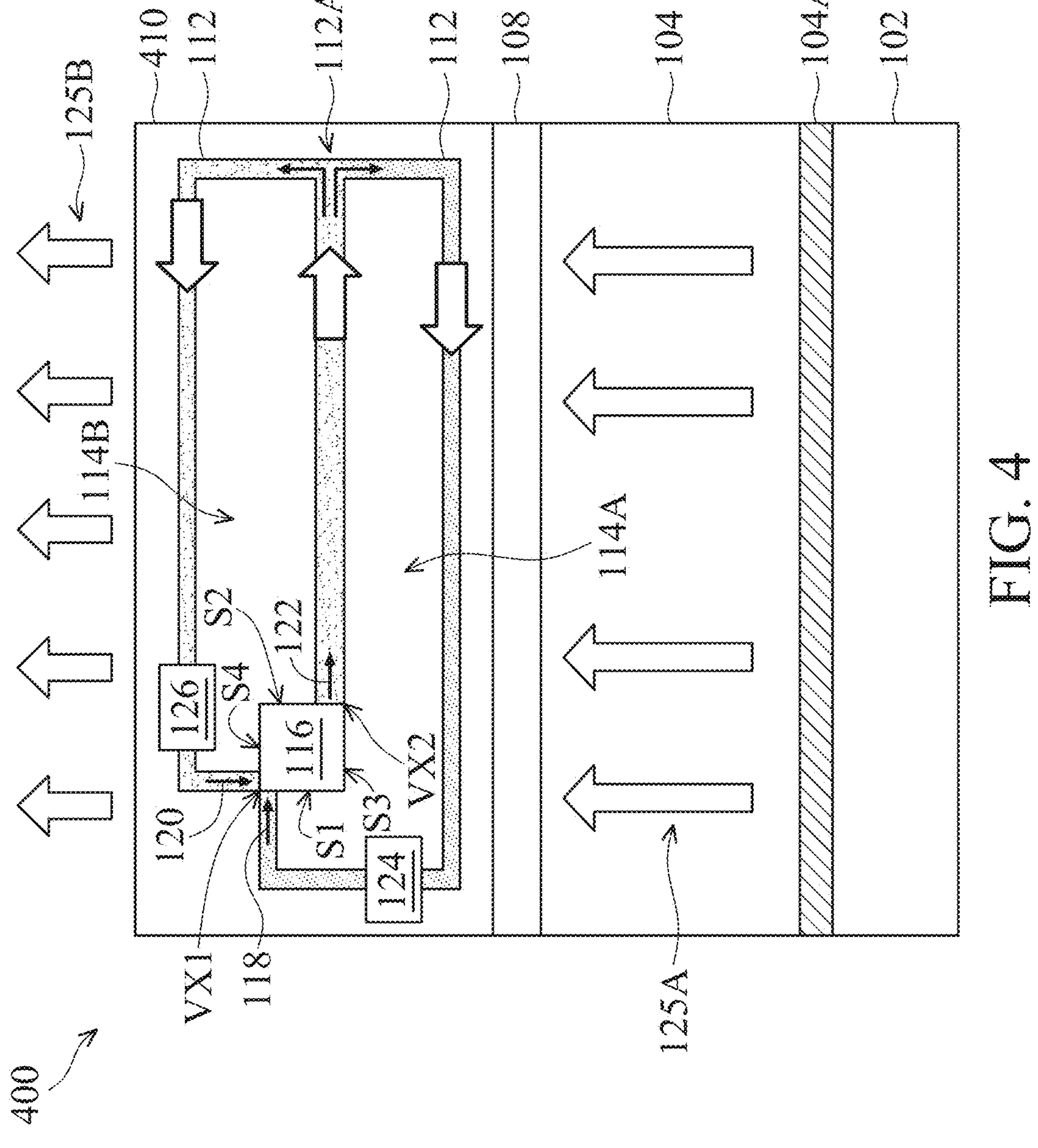
FIGS. 4, 5, 6, 7, 8, 9, and 10 illustrate cross-section views of IC structures including IHS structures of various alternative designs, according to some embodiments.

FIG. 4 illustrates a cross-section view of a semiconductor or IC structure 400 including the substrate 102, the die 104 and an integrated heat sink (IHS) structure 410 coupled to the die 104 using the TIM layer 108. The substrate 102, the die 104, and the TIM layer 108 may be substantially the same as discussed above. The IHS structure 410, like the IHS structure 110, includes the plurality of microchannels 112 and the micromixer chamber 116 (having the exemplary square or rectangular shape, as discussed above), that together provide the first closed-loop microchannel structure 114A and the second closed-loop microchannel structure 114B, through which a liquid coolant is configured to flow. However, the configuration of the IHS structure 410 provides a different position and orientation, as compared to the IHS structure 110, of the first and second inlets 118, 120 and the outlet 122 with respect to the micromixer chamber 116, thereby providing a different thermal exchange efficiency than the IHS structure 110. For example, in the IHS structure 410, the first inlet 118 is fluidly coupled to a top portion of the first side S1 of the micromixer chamber 116 adjacent to a first vertex VX1 of the micromixer chamber 116, and the second inlet 120 is fluidly coupled to a lateral portion of the fourth side S4 of the micromixer chamber 116 adjacent to the first side S1 and adjacent to the first vertex VX1. The first inlet 118 and the second inlet 120 are also oriented perpendicular to each other and perpendicular to respective planes defined by the first side S1 and the fourth side S4 of the micromixer chamber 116. The outlet 122, as shown, is fluidly coupled to a bottom portion of the second side S2 of the micromixer chamber 116 (opposite the first side S1) and adjacent to a second vertex VX2 diagonally opposite the first vertex VX1, and the outlet 122 is oriented perpendicular to a plane defined by the second side S2 of the micromixer chamber 116.

In the example of the IHS structure 410, like the IHS structure 110, the first closed-loop microchannel structure 114A is disposed adjacent to (e.g., nearer to) the underlying die 104, while the second closed-loop microchannel structure 114B is disposed over the first closed-loop microchannel structure 114A. The second closed-loop microchannel structure 114B is thus disposed further away from the die 104 than the first closed-loop microchannel structure 114A. In various implementations, the IHS structure 410 (like the IHS structure 110) includes the first pump 124 coupled to the first inlet 118 and the second pump 126 coupled to the second inlet 120 to control the liquid injected into the micromixer chamber 116 via respective ones of the first inlet 118 and the second inlet 120.

During operation of the IHS structure 410, heat 125A generated by the die 104 will largely be transferred to liquid flowing through the first closed-loop microchannel structure 114A as liquid travels adjacent to the die 104 through the microchannel 112 of the first closed-loop microchannel structure 114A. Thus, the liquid entering the micromixer chamber 116 via the first inlet 118 (the hot inlet) may be hotter than liquid entering the micromixer chamber 116 via the second inlet 120 (the cold inlet). The micromixer chamber 116, including the hot and cold inlets (first and second inlets 118, 120), provides for mixing of the hot/cold liquids entering the hot/cold inlets, resulting in enhanced thermal exchange at the outlet 122. In particular, in the IHS structure 410, the relative distance between the inlets 118, 120 and the outlet 122 is greater than the distance between the inlets 118, 120 and the outlet 122 in the IHS structure 110. As a result, the thermal exchange between the hot and cold liquids within the micromixer chamber 116 may be even more effective for the IHS structure 410 than for the IHS structure 110. The liquid flowing from the outlet 122 will be divided at a microchannel junction 112A, where a first part of the liquid proceeds through the first closed-loop microchannel structure 114A and a second part of the liquid proceeds through the second closed-loop microchannel structure 114B. In the present example, the heat 125B may largely transfer away from the IHS structure 410 via the microchannel 112 of the second closed-loop microchannel structure 114B as the liquid travels adjacent to a top surface of the IHS structure 410, thereby ensuring that the liquid entering the micromixer chamber 116 via the second inlet 120 remains cooler than the liquid entering the micromixer chamber 116 via the first inlet 118.

Figure 5:
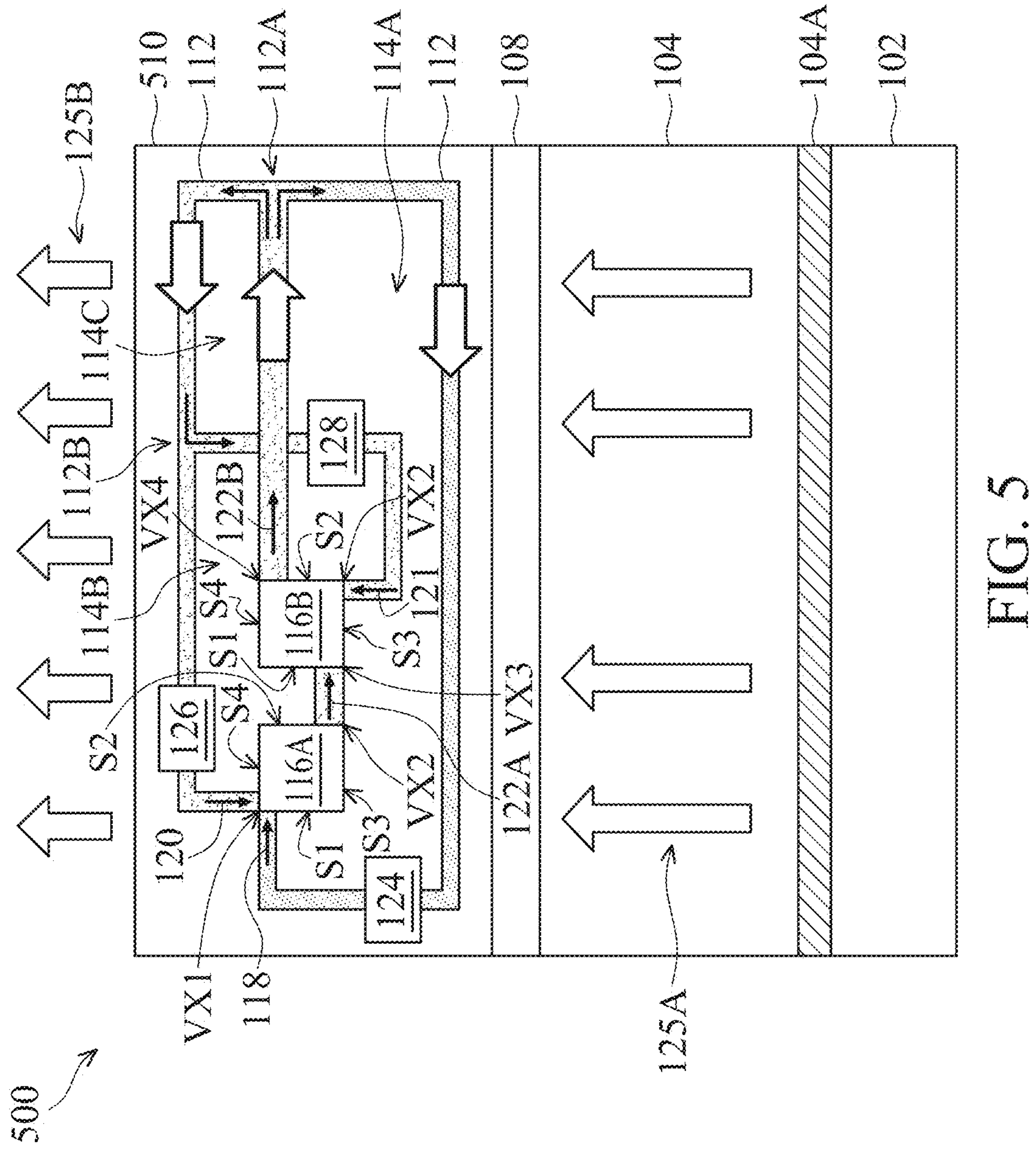

FIG. 5 illustrates a cross-section view of a semiconductor or IC structure 500 including the substrate 102, the die 104 and an integrated heat sink (IHS) structure 510 coupled to the die 104 using the TIM layer 108. The substrate 102, the die 104, and the TIM layer 108 may be substantially the same as discussed above. The IHS structure 510, like the IHS structure 110, includes the plurality of microchannels 112 but also includes plural micromixer chambers 116A, 116B (having the exemplary square or rectangular shape, as discussed above), that collectively provide the first closed-loop microchannel structure 114A, the second closed-loop microchannel structure 114B, and a third closed-loop microchannel structure 114C through which a liquid coolant is configured to flow. In addition to the plural micromixer chambers 116A, 116B, the configuration of the IHS structure 510 provides different positions and orientations of the various inlets (into respective ones of the plural micromixer chambers 116A, 116B) and the outlets (out of respective ones of the plural micromixer chambers 116A, 116B), thereby providing a different thermal exchange efficiency than the IHS structure 110. For example, in the IHS structure 510, the first inlet 118 is fluidly coupled to a top portion of the first side S1 of a first micromixer chamber 116A adjacent to the first vertex VX1 of the first micromixer chamber 116A, the second inlet 120 is fluidly coupled to a lateral portion of the fourth side S4 of the first micromixer chamber 116A adjacent to the first side S1 and adjacent to the first vertex VX1 of the first micromixer chamber 116A. The first inlet 118 and the second inlet 120 are also oriented perpendicular to each other and perpendicular to respective planes defined by the first side S1 and the fourth side S4 of the first micromixer chamber 116A. The outlet 122A of the first micromixer chamber 116A, as shown, is fluidly coupled to a bottom portion of the second side S2 of the first micromixer chamber 116A (opposite the first side S1) and adjacent to the second vertex VX2 diagonally opposite the first vertex VX1, and the outlet 122A is oriented perpendicular to a plane defined by the second side S2 of the first micromixer chamber 116A. The outlet 122A of the first micromixer chamber 116A is then fluidly coupled as a first inlet to a second micromixer chamber 116B. In particular, the outlet 122A is fluidly coupled to a bottom portion of the first side S1 of the second micromixer chamber 116B adjacent to a third vertex VX3 of the second micromixer chamber 116B, and a third inlet 121 is fluidly coupled to a lateral portion of the third side S3 of the second micromixer chamber 116B adjacent to the first side S1 and adjacent to the second vertex VX2 of the second micromixer chamber 116B. The outlet 122A (which is an inlet to the second micromixer chamber 116B) and the third inlet 121 are oriented perpendicular to each other and perpendicular to respective planes defined by the first side S1 and the third side S3 of the second micromixer chamber 116B. The outlet 122B of the second micromixer chamber 116B, as shown, is fluidly coupled to a top portion of the second side S2 of the second micromixer chamber 116B (opposite the first side S1) and adjacent to a fourth vertex VX4 diagonally opposite the third vertex VX3, and the outlet 122B is oriented perpendicular to a plane defined by the second side S2 of the second micromixer chamber 116B.

In the example of the IHS structure 510, the first closed-loop microchannel structure 114A is disposed adjacent to (e.g., nearer to) the underlying die 104, while the second closed-loop microchannel structure 114B and the third closed-loop microchannel structure 114C are disposed over the first closed-loop microchannel structure 114A. The second closed-loop microchannel structure 114B and the third closed-loop microchannel structure 114C are thus disposed further away from the die 104 than the first closed-loop microchannel structure 114A. In various implementations, the IHS structure 510 includes the first pump 124 coupled to the first inlet 118, the second pump 126 coupled to the second inlet 120, and a third pump 128 coupled to the third inlet 121 to control the liquid injected into each of the first and second micromixer chambers 116A, 116B via respective ones of the first inlet 118, the second inlet 120, and the third inlet 121. In some examples, a pump may further be disposed along the outlet 122A (which is an inlet to the second micromixer chamber 116B).

During operation of the IHS structure 510, heat 125A generated by the die 104 will largely be transferred to liquid flowing through the first closed-loop microchannel structure 114A as liquid travels adjacent to the die 104 through the microchannel 112 of the first closed-loop microchannel structure 114A. Thus, the liquid entering the first micromixer chamber 116A via the first inlet 118 (the hot inlet) may be hotter than liquid entering the first micromixer chamber 116A via the second inlet 120 (the cold inlet). The liquid flowing from the outlet 122A, having been at least partially cooled via the first micromixer chamber 116A, is provided to the second micromixer chamber 116B and may be at least somewhat warmer than liquid entering the second micromixer chamber 116B via the third inlet 121 (the cold inlet). The liquid flowing from the outlet 122B, having been further cooled via the second micromixer chamber 116B, will be divided at a microchannel junction 112A, where a first part of the liquid proceeds through the first closed-loop microchannel structure 114A and a second part of the liquid proceeds through the second and third closed-loop microchannel structures 114B, 114C (e.g., the second part of the liquid divided at a microchannel junction 112B to be directed to each of the first and second micromixer chambers 116A, 116B). In the present example, the heat 125B may largely transfer away from the IHS structure 510 via the microchannel 112 of the second and third closed-loop microchannel structures 114B, 114C as the liquid travels adjacent to a top surface of the IHS structure 510, thereby ensuring that the liquid entering the first and second micromixer chambers 116A, 116B via the second and third inlets 120, 121, respectively, remains cooler than the liquid entering the first micromixer chamber 116A via the first inlet 118 or cooler than the liquid entering the second micromixer chamber 116B via the outlet 122A. It is noted that, in some cases, the second closed-loop microchannel structure 114B may be larger than the third closed-loop microchannel structure 114C such that liquid traveling through the second closed-loop microchannel structure 114B may have more time (microchannel 112 distance to travel) to cool. In such cases, the liquid entering the first micromixer chamber 116A via the second inlet 120 may be at least somewhat cooler than the liquid entering the second micromixer chamber 116B via the third inlet 121.

Each of the first and second micromixer chambers 116A, 116B, in the example of the IHS structure 510, provides for mixing of the hot/cold liquids entering via respective hot/cold inlets, resulting in enhanced thermal exchange at the outlets 122A, 122B. For instance, in the IHS structure 510, the relative distance between the inlets 118, 120 and the outlet 122A is greater than the distance between the inlets 118, 120 and the outlet 122 in the IHS structure 110. Further, in the IHS structure 510, the additional micromixer chamber (the second micromixer chamber 116B) provides increased thermal exchange and overall increased cooling. In some examples, each of plural micromixer chambers 116A, 116B may be described as cooling stages or thermal exchange stages. Thus, it will be understood that as the number of micromixer chambers increases, the thermal exchange efficiency of the IHS structure will also increase. A total number of micromixer chambers that may be implemented in a given IHS structure may be based on a manufacturing process and size of the IHS structure, but in some examples the total number of micromixer chambers in a given IHS structure may be in a range of about 1-5. In other examples, the total number of micromixer chambers in a given IHS structure may be in a range of about 1-10.

Figure 6:
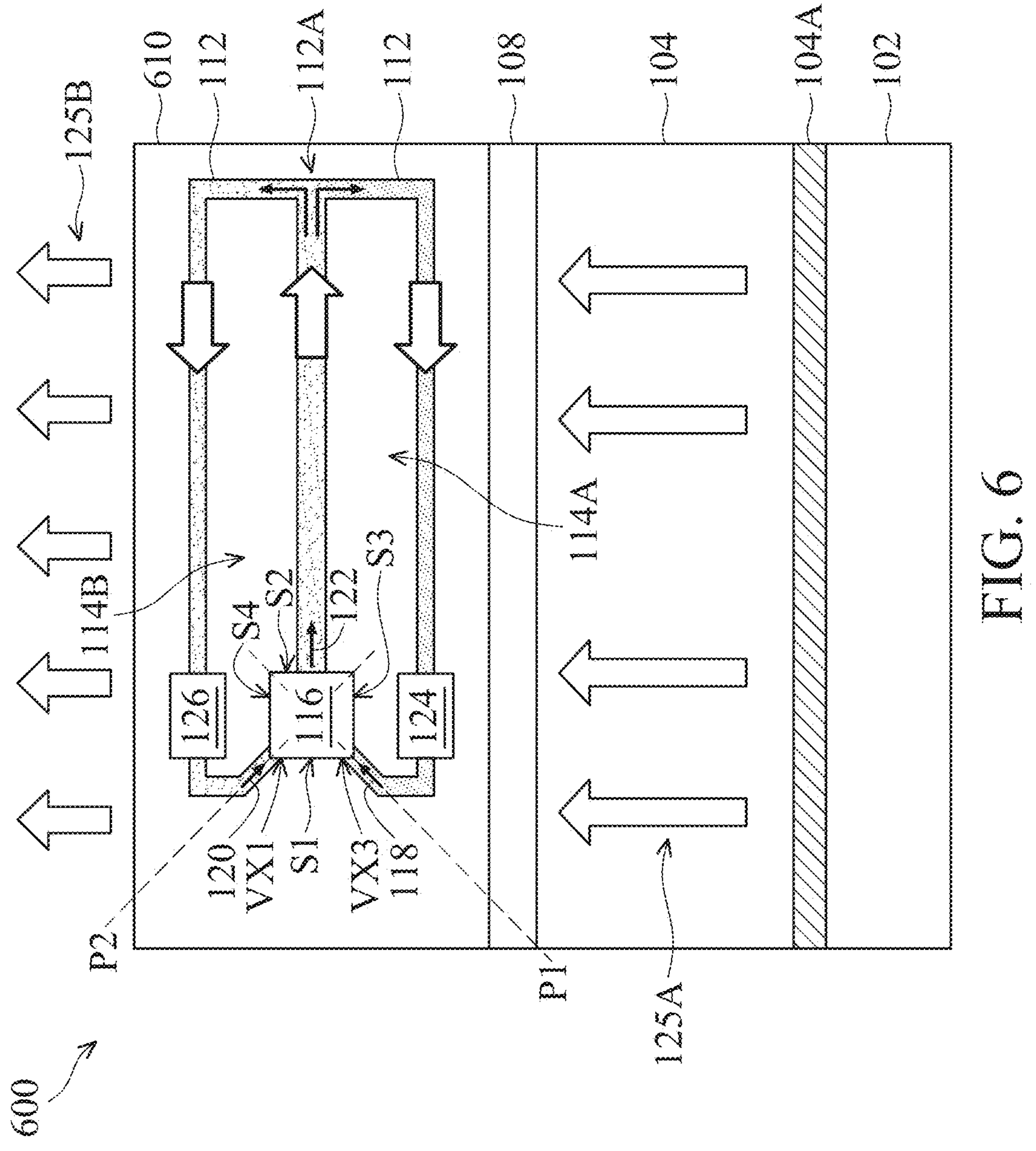

FIG. 6 illustrates a cross-section view of a semiconductor or IC structure 600 including the substrate 102, the die 104 and an integrated heat sink (IHS) structure 610 coupled to the die 104 using the TIM layer 108. The substrate 102, the die 104, and the TIM layer 108 may be substantially the same as discussed above. The IHS structure 610, like the IHS structure 110, includes the plurality of microchannels 112 and the micromixer chamber 116 (having the exemplary square or rectangular shape, as discussed above), that together provide the first closed-loop microchannel structure 114A and the second closed-loop microchannel structure 114B, through which a liquid coolant is configured to flow. However, the configuration of the IHS structure 610 provides a different position and orientation, as compared to the IHS structure 110, of the first and second inlets 118, 120 with respect to the micromixer chamber 116, thereby providing a different thermal exchange efficiency than the IHS structure 110. For example, in the IHS structure 610, the first inlet 118 is fluidly coupled to the third vertex VX3 of the micromixer chamber 116 and oriented substantially coplanar with a first diagonal plane P1 including the third vertex VX3. In some cases, the first inlet 118 may be alternatively fluidly coupled to the first side S1 or the third side S3 of the micromixer chamber 116 adjacent to a third vertex VX3 of the micromixer chamber 116 and oriented along an adjacent diagonal plane that is parallel to the first diagonal plane P1 including the third vertex VX3. Further, in some examples, the second inlet 120 is fluidly coupled to the first vertex VX1 of the micromixer chamber 116 and oriented substantially coplanar with a second diagonal plane P2 including the first vertex VX1. In some cases, the second inlet 120 may be alternatively fluidly coupled to the first side S1 or the fourth side S4 of the micromixer chamber 116 adjacent to the first vertex VX1 of the micromixer chamber 116 and oriented along an adjacent diagonal plane that is parallel to the second diagonal plane P2 including the first vertex VX1. The outlet 122, as shown, is fluidly coupled to a central portion of the second side S2 of the micromixer chamber 116 (opposite the first side S1), and the outlet 122 is oriented perpendicular to a plane defined by the second side S2 of the micromixer chamber 116.

In the example of the IHS structure 610, like the IHS structure 110, the first closed-loop microchannel structure 114A is disposed adjacent to (e.g., nearer to) the underlying die 104, while the second closed-loop microchannel structure 114B is disposed over the first closed-loop microchannel structure 114A. The second closed-loop microchannel structure 114B is thus disposed further away from the die 104 than the first closed-loop microchannel structure 114A. In various implementations, the IHS structure 610 (like the IHS structure 110) includes the first pump 124 coupled to the first inlet 118 and the second pump 126 coupled to the second inlet 120 to control the liquid injected into the micromixer chamber 116 via respective ones of the first inlet 118 and the second inlet 120.

During operation of the IHS structure 610, heat 125A generated by the die 104 will largely be transferred to liquid flowing through the first closed-loop microchannel structure 114A and heat 125B may largely transfer away from the IHS structure 610 via the microchannel 112 of the second closed-loop microchannel structure 114B as the liquid travels adjacent to a top surface of the IHS structure 610, as previously described. Thus, the liquid entering the micromixer chamber 116 via the first inlet 118 (the hot inlet) may be hotter than liquid entering the micromixer chamber 116 via the second inlet 120 (the cold inlet). The micromixer chamber 116, including the hot and cold inlets (first and second inlets 118, 120), provides for mixing of the hot/cold liquids entering the hot/cold inlets, resulting in enhanced thermal exchange at the outlet 122. In particular, the arrangement of the first and second inlets 118, 120 in the IHS structure 610, as compared to the IHS structure 110, provides a different thermal exchange efficiency to accommodate a different heat sinks, a different die, or a different die package, in accordance with various embodiments.

Figure 7:
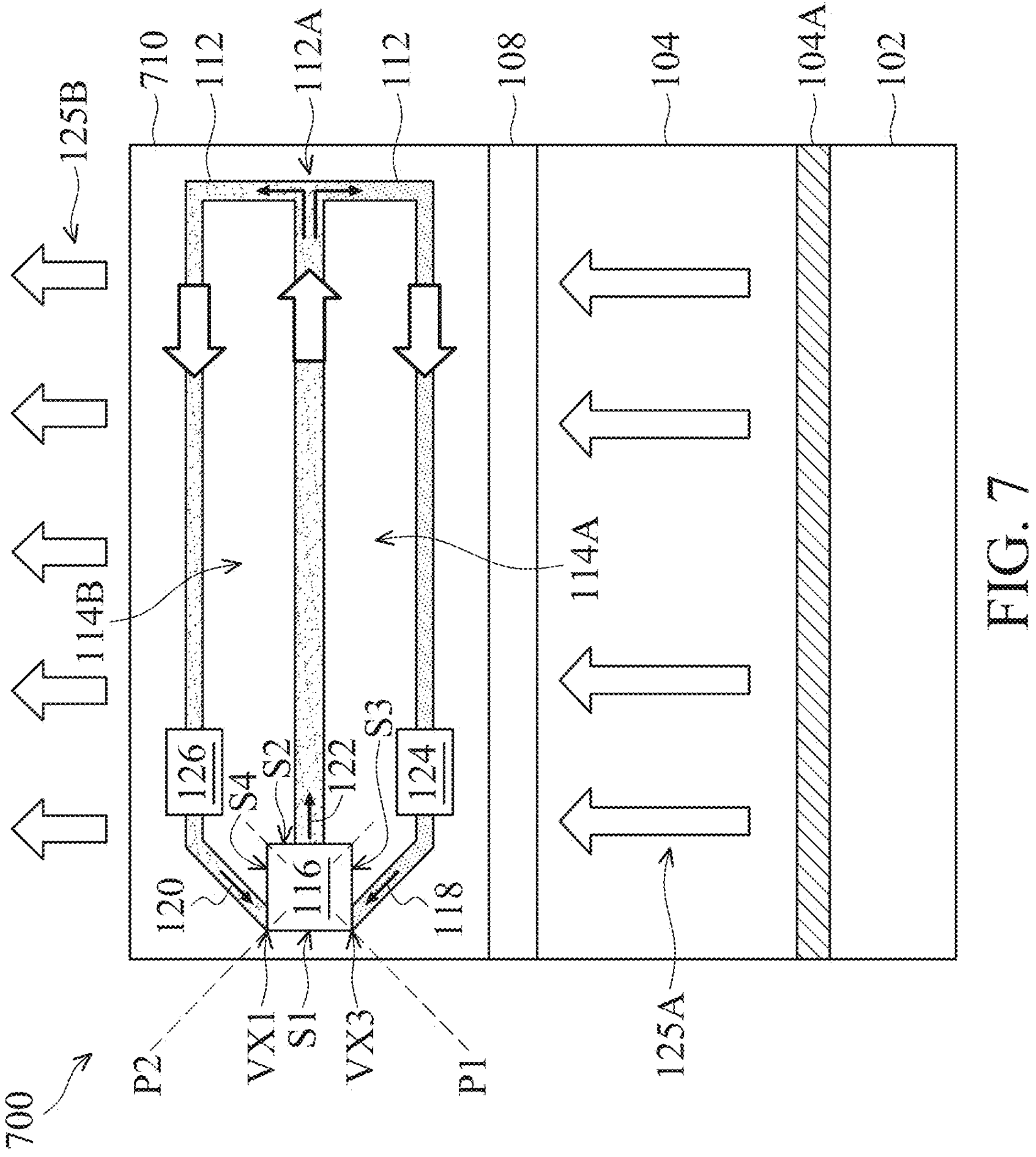

FIG. 7 illustrates a cross-section view of a semiconductor or IC structure 700 including the substrate 102, the die 104 and an integrated heat sink (IHS) structure 710 coupled to the die 104 using the TIM layer 108. The substrate 102, the die 104, and the TIM layer 108 may be substantially the same as discussed above. The IHS structure 710 is similar in many respects to the IHS structure 610, discussed above. However, the configuration of the IHS structure 710 provides a different position and orientation, as compared to the IHS structure 610, of the first and second inlets 118, 120 with respect to the micromixer chamber 116, thereby providing a different thermal exchange efficiency than the IHS structure 610. For example, in the IHS structure 710, the first inlet 118 is fluidly coupled to the third side S3 of the micromixer chamber 116 adjacent to a third vertex VX3 of the micromixer chamber 116 and oriented along a diagonal plane that is parallel to the second diagonal plane P2 including the first vertex VX1 of the micromixer chamber 116. Further, in some examples, the second inlet 120 is fluidly coupled to the fourth side S4 of the micromixer chamber 116 adjacent to the first vertex VX1 of the micromixer chamber 116 and oriented along a diagonal plane that is parallel to the first diagonal plane P1 including the third vertex VX3. The outlet 122, as shown, is fluidly coupled to a central portion of the second side S2 of the micromixer chamber 116 (opposite the first side S1), and the outlet 122 is oriented perpendicular to a plane defined by the second side S2 of the micromixer chamber 116.

Figure 8:
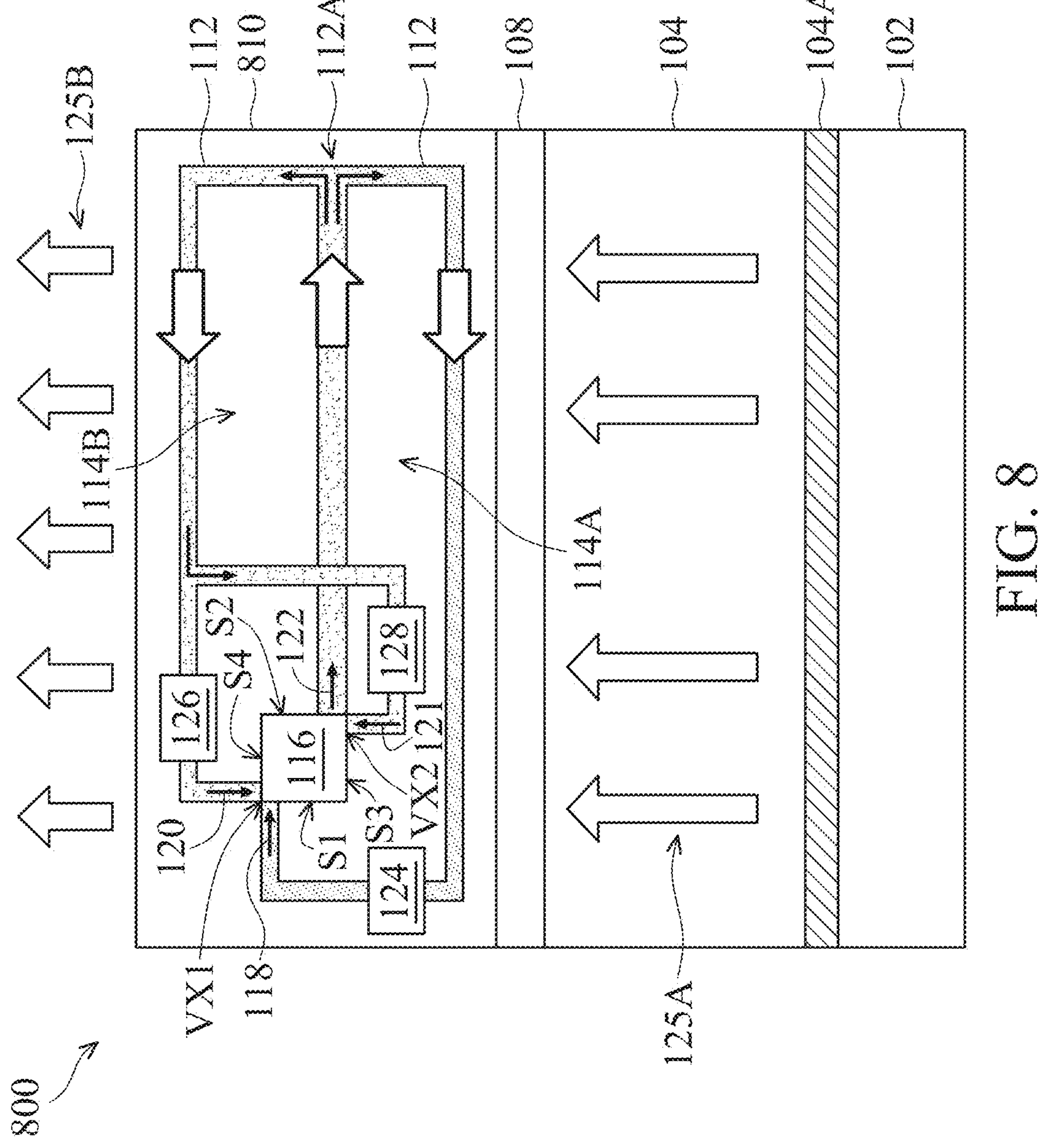

FIG. 8 illustrates a cross-section view of a semiconductor or IC structure 800 including the substrate 102, the die 104 and an integrated heat sink (IHS) structure 810 coupled to the die 104 using the TIM layer 108. The substrate 102, the die 104, and the TIM layer 108 may be substantially the same as discussed above. The IHS structure 810 is similar in many respects to the IHS structure 410, discussed above. However, the IHS structure 810 provides a different configuration including an additional inlet 121 to the micromixer chamber 116, as compared to the IHS structure 410, thereby providing a different thermal exchange efficiency than the IHS structure 410. In addition to the first inlet 118, the second inlet 120, and the outlet 122 fluidly coupled to the micromixer chamber 116, as discussed above with reference to the IHS structure 410, the IHS structure 810 further includes a third inlet 121 that is fluidly coupled to a lateral portion of the third side S3 of the micromixer chamber 116 adjacent to the second vertex VX2 of the micromixer chamber 116. The third inlet 121 is oriented perpendicular to the outlet 122 and to the plane defined by the third side S3 of the micromixer chamber 116.

Figure 9:
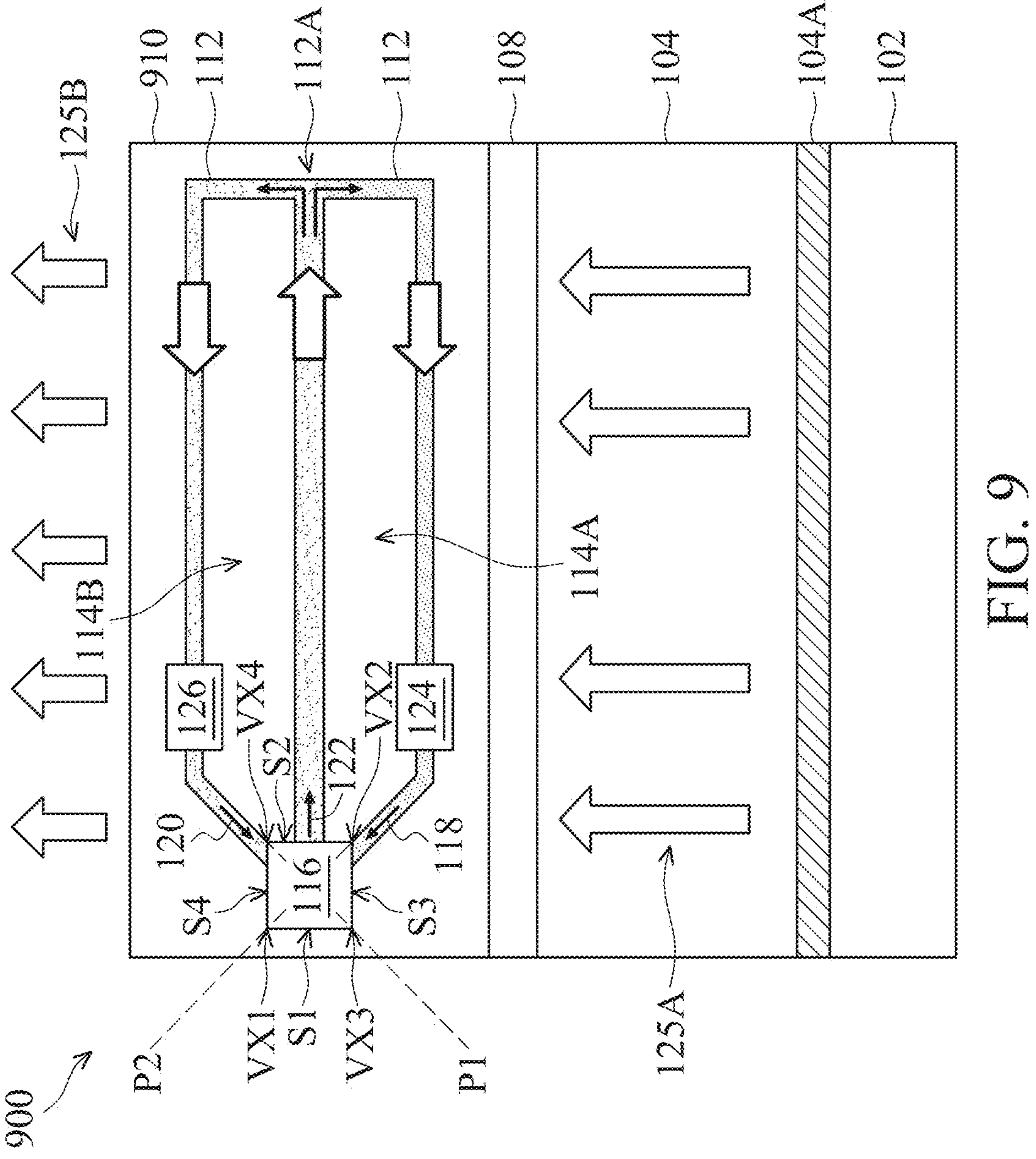

FIG. 9 illustrates a cross-section view of a semiconductor or IC structure 900 including the substrate 102, the die 104 and an integrated heat sink (IHS) structure 910 coupled to the die 104 using the TIM layer 108. The substrate 102, the die 104, and the TIM layer 108 may be substantially the same as discussed above. The IHS structure 910 is similar in many respects to the IHS structure 710, discussed above. However, the configuration of the IHS structure 910 provides a different position, as compared to the IHS structure 710, of the first and second inlets 118, 120 with respect to the micromixer chamber 116, thereby providing a different thermal exchange efficiency than the IHS structure 710. For example, in the IHS structure 910, the first inlet 118 is fluidly coupled to the third side S3 of the micromixer chamber 116 adjacent to a second vertex VX2 of the micromixer chamber 116 and oriented along a diagonal plane that is parallel to the second diagonal plane P2 including the first vertex VX1 and the second vertex VX2 of the micromixer chamber 116. Further, in some examples, the second inlet 120 is fluidly coupled to the fourth side S4 of the micromixer chamber 116 adjacent to the fourth vertex VX4 of the micromixer chamber 116 and oriented along a diagonal plane that is parallel to the first diagonal plane P1 including the third vertex VX3 and the fourth vertex VX4 of the micromixer chamber 116. Stated another way, in the IHS structure 910, the positions along respective third and fourth sides S3, S4 of the micromixer chamber 116, at which respective ones of the first and second inlets 118, 120 are fluidly coupled, is shifted as compared to the IHS structure 710. The outlet 122, as shown, is fluidly coupled to a central portion of the second side S2 of the micromixer chamber 116 (opposite the first side S1), and the outlet 122 is oriented perpendicular to a plane defined by the second side S2 of the micromixer chamber 116.

Figure 10:
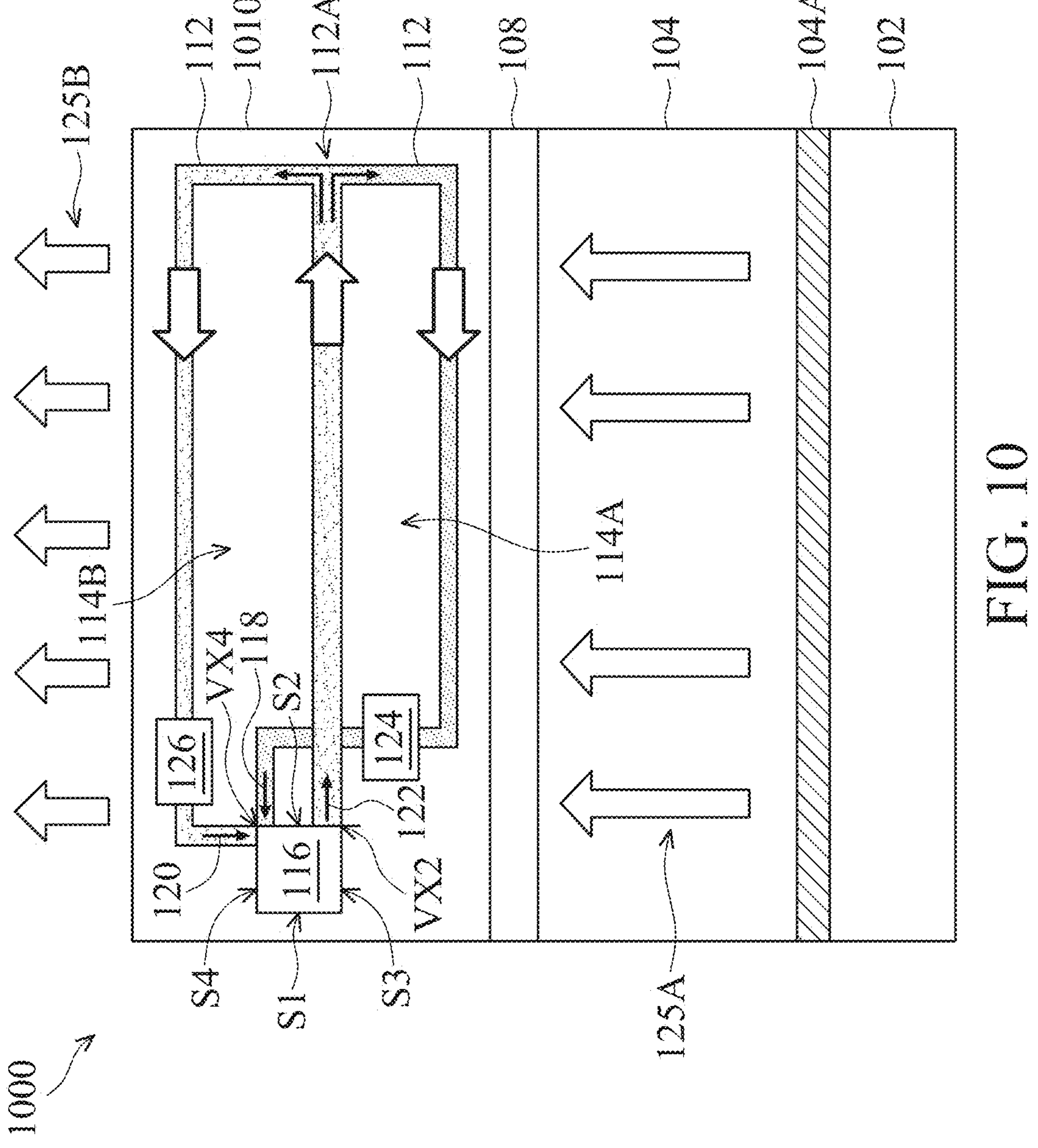

FIG. 10 illustrates a cross-section view of a semiconductor or IC structure 1000 including the substrate 102, the die 104 and an integrated heat sink (IHS) structure 1010 coupled to the die 104 using the TIM layer 108. The substrate 102, the die 104, and the TIM layer 108 may be substantially the same as discussed above. The IHS structure 1010 is similar in many respects to the IHS structure 410, discussed above. However, the IHS structure 1010 provides a different configuration including a different position and orientation, as compared to the IHS structure 410, of the first and second inlets 118, 120 with respect to the micromixer chamber 116, thereby providing a different thermal exchange efficiency than the IHS structure 410. For example, in the IHS structure 1010, the first inlet 118 is fluidly coupled to a top portion of the second side S2 of the micromixer chamber 116 adjacent to a fourth vertex VX4 of the micromixer chamber 116, and the second inlet 120 is fluidly coupled to a lateral portion of the fourth side S4 of the micromixer chamber 116 adjacent to the fourth vertex VX4. The first inlet 118 and the second inlet 120 are also oriented perpendicular to each other and perpendicular to respective planes defined by the second side S2 and the fourth side S4 of the micromixer chamber

116. The outlet 122, as shown, is fluidly coupled to a bottom portion of the second side S2 of the micromixer chamber 116 (opposite the first side S1) and adjacent to a second vertex VX2. Thus, the first inlet 118 and the outlet 122 are fluidly coupled to different portions of the same side (the second side S2) of the micromixer chamber 116. The outlet 122, as shown, is also oriented perpendicular to a plane defined by the second side S2 of the micromixer chamber 116.

While the examples of FIGS. 1 and 4-10 provided exemplary embodiments of various designs of an IHS structure, it will be understood that such as examples are not meant to be limiting, and other embodiments having other configurations may be equally implemented without departing from the scope of the present disclosure. As one example, one or more of the plurality of microchannels 112 employed in an IHS structure may have a bending or curved shape (e.g., from a top view or from a side view), may have a variety of cross-sectional shapes through which a liquid flows (e.g., such as square, rectangular, circular, oval, elliptical, triangular, trapezoidal, hexagonal, pentagonal, or other polygon shape, and/or may be arranged in any of a variety of orientations with respect to each other and with respect to one or more micromixer chambers. As another example, while the embodiments of FIGS. 1 and 4-10 illustrate IHS structures having a single IHS device (e.g., including respective microchannels, micromixer chamber(s), and closed-loop microchannel structures) disposed over a given die, in some cases IHS structures having two or three IHS devices (each having their own respective microchannels, micromixer chamber(s), and closed-loop microchannel structures) may be disposed over the given die (e.g., by reducing the microchannel path for each of the plural IHS devices). Regardless of the exact configuration of the IHS structure, each of the various designs may provide a different thermal exchange efficiency to accommodate different heat sinks, different die, or different die packages. Stated another way, regardless of the exact configuration of the IHS structure, the various designs shown and described herein may be used to accommodate different types of heat-generating devices generating different amounts of heat.

Figure 11:
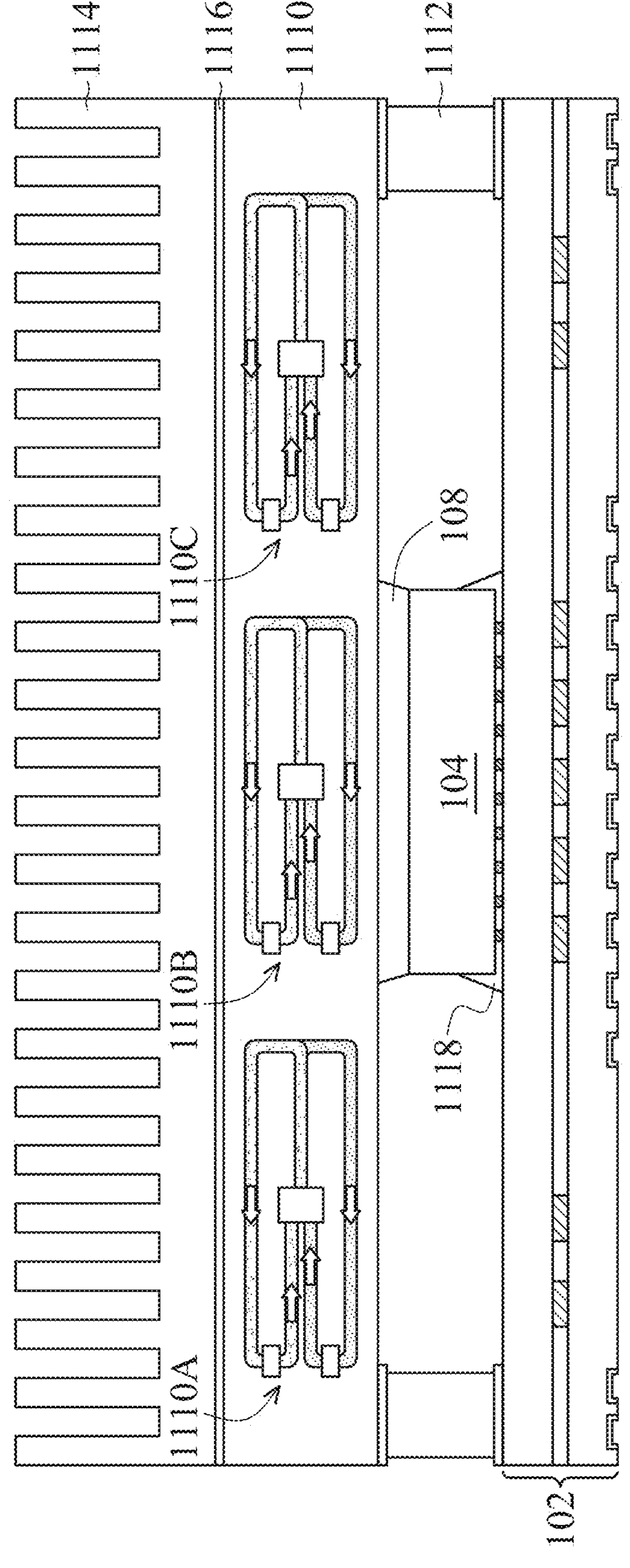
FIG. 11 illustrates an integrated circuit (IC) cooling assembly including an IHS structure, according to some embodiments.
Figure 11A:
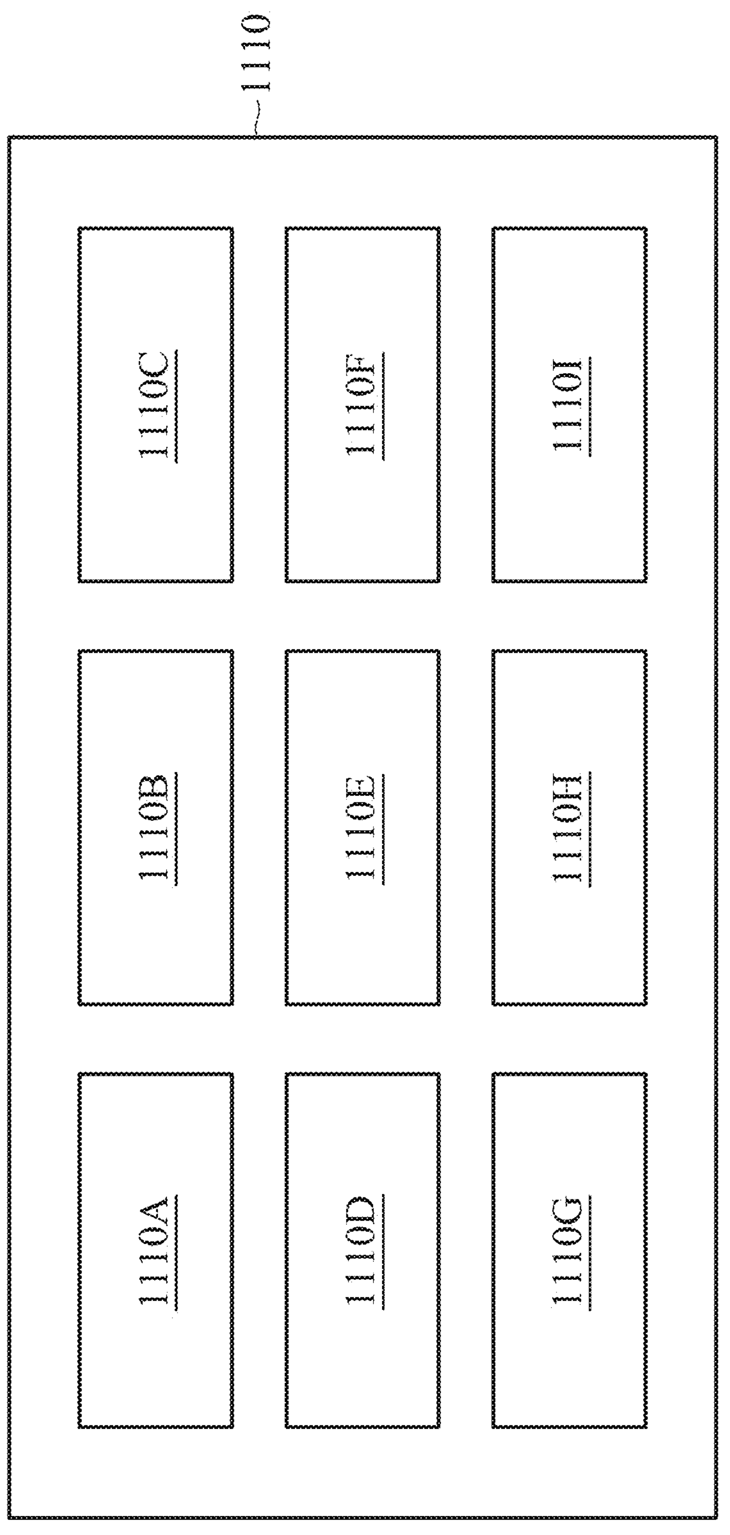
FIG. 11A illustrates a top-down view of the IC cooling assembly of FIG. 11, according to some embodiments.

Referring now to FIG. 11, illustrated therein is an integrated circuit (IC) cooling assembly 1100 including an integrated heat sink (IHS) structure, in accordance with some embodiments. As shown, the IC cooling assembly 1100 includes the substrate 102 (e.g., such as a package substrate), the die 104 (e.g., flip-chip bonded to the substrate 102), and an underfill 1118 disposed between the die 104 and the substrate 102. An IHS structure 1110 is coupled to the die 104 using the TIM layer 108, as previously discussed. In addition, as the IHS structure 1110 has a larger surface area as compared to the die 104, stiffeners or standoffs 1112 may be coupled between lateral ends of the IHS structure 1110 and the underlying substrate 102 (e.g., using an appropriate adhesive), thereby providing additional support to the IHS structure 1110. To be sure, in some cases, the IHS structure 1110 may be implemented as part of a package lid that contacts and/or bonds to the substrate 102 without separate stiffeners or standoffs 1112. In some embodiments, the IC cooling assembly 1100 further includes an external heat sink 1114 coupled to a top surface of the IHS structure 1110 using a TIM layer 1116. In some examples, the TIM layer 1116 may be similar to the TIM layer 108. The IHS structure 1110, in particular and due to the larger surface area as compared to the die 104, may include a plurality of IHS devices 1110A, 1110B, 1110C (each having their own respective microchannels, micromixer chamber(s), and closed-loop microchannel structures). While each of the IHS devices 1110A, 1110B, 1110C of the IHS structure 1110 are illustrated as having the configuration of the IHS structure 110 of FIG. 1, it will be understood that in various embodiments, each of the IHS devices 1110A, 1110B, 1110C may have a configuration corresponding to any of the IHS structures of FIGS. 1 and 4-10, as discussed above. Thus, the IC cooling assembly 1100, having the plurality of IHS devices 1110A, 1110B, 1110C and the external heat sink 1114 will provide a greatly enhanced thermal exchange and increased cooling of the die 104. Moreover, in accordance with the embodiments disclosed herein and even without the external heat sink 1114, the plurality of IHS devices 1110A, 1110B, 1110C and their respective microchannels, micromixer chamber(s), and closed-loop microchannel structures, will provide enhanced thermal exchange and increased cooling of the die 104. Also, while the IC cooling assembly 1100 is illustrated as including three IHS devices 1110A, 1110B, 1110C, it will be understood that the IC cooling assembly 1100 may include more than three IHS devices. For instance, as shown in the exemplary top-down view of the IC cooling assembly 1100 of FIG. 11A, the IHS structure 1110 may include a 3×3 array of IHS devices such as IHS devices 1110A-1110I. In some cases, the IHS structure 1110 may alternatively include a 4×4 array or a 5×5 array of IHS devices (e.g., by reducing the microchannel path for each of the plural IHS devices). Generally, in various other embodiments, the IHS structure 1110 may include an array of IHS devices having a different number of IHS devices (e.g., depending on designs/configurations of each of the plural IHS devices formed as part of the IHS structure 1110).

Figure 12B:
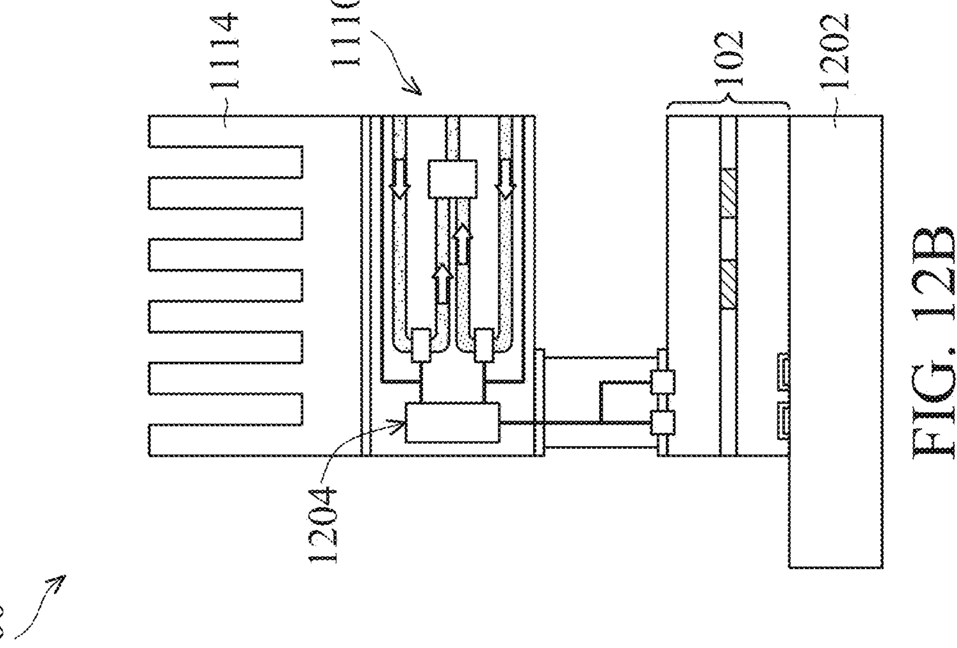

With reference to FIGS. 12A and 12B, illustrated therein are portions of an IC cooling assembly (such as discussed with reference to FIG. 11) further showing the substrate 102 mounted onto an underlying PCB 1202. The exemplary embodiments of FIGS. 12A and 12B are included to show an example of providing electrical power and control signals to the pumps (e.g., such as EHD pumps) of the various IHS devices disposed within the IHS structure 1110. In some cases, a power/control circuit 1204 may be coupled to the IHS structure 1110 (e.g., along a side of the IHS structure 1110, embedded within the IHS structure 1110, on top of the IHS structure 1110 for instance when the external heat sink 1114 is not used), the power/control circuit 1204 may be coupled to a surface of the PCB 1202, or the power/control circuit 1204 may be disposed on a top surface of the substrate 102 (e.g., adjacent to the die 104). Regardless of where the power/control circuit 1204 is disposed, electrical connections may be provided from the PCB 1202 and/or the substrate 102 through wires, electrical traces, vias, bumps, balls, pillars, or other appropriate conductive layers, to each of the pumps of the IHS devices disposed within the IHS structure 1110. The electrical connections, in turn, may be used to provide the OIP control for each of the pumps injecting liquid into a micromixer chamber, and to provide electrical power to operate the pumps (e.g., such as providing an applied voltage to an EHD pump).

Figure 13:
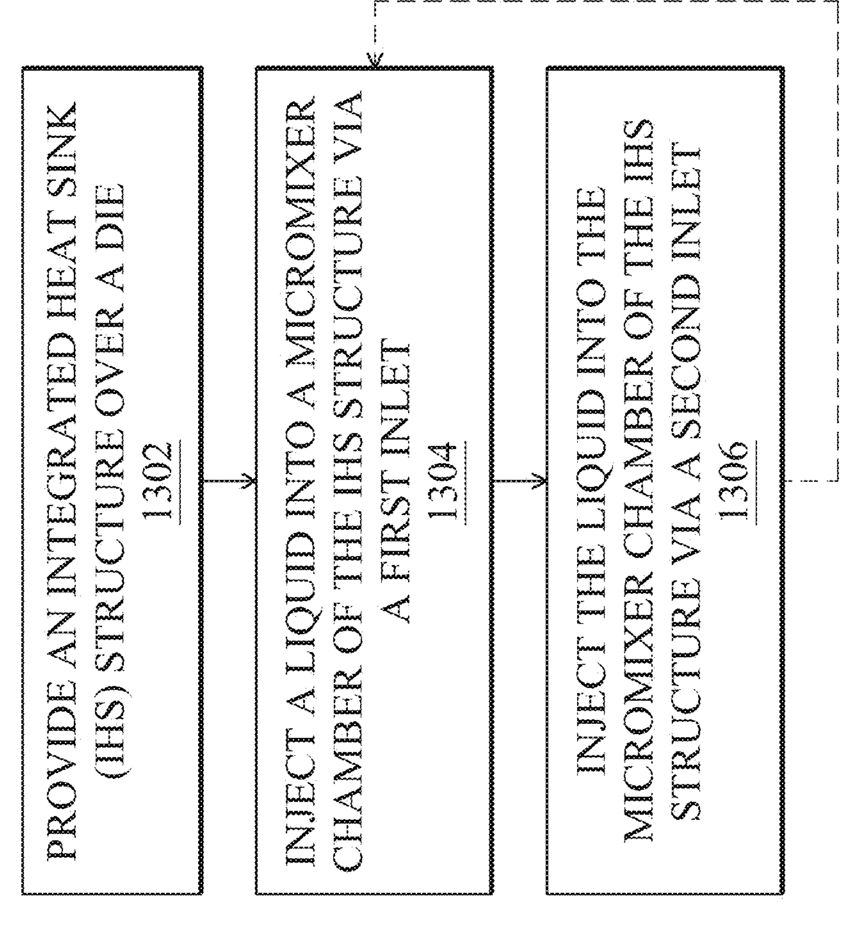
FIG. 13 illustrates a flow chart of a method of cooling an IC die using an IHS structure, according to some embodiments.

Referring to FIG. 13, illustrated is a general method 1300 of cooling an integrated circuit (IC) die using an IHS structure, such as the IHS structures discussed above, in accordance with some embodiments. For purposes of clarity, the method 1300 is described below in more detail with reference to FIGS. 1, 2A, and 2B, discussed above. However, it will be understood that the steps described with reference to the method 1300 may be equally implemented for other IHS structures such as those described with reference to FIGS. 4-10, or for the IC cooling assembly of FIGS. 11, 12A, and 12B. Moreover, it will be understood that additional process steps may be implemented before, during, and after the method 1300, and some process steps described may be replaced or eliminated in accordance with various embodiments of the method 1300.

The method 1300 begins at block 1302 where an IHS structure is provided over a die. For purposes of this discussion, and with reference to FIG. 1, the IHS structure 110 is provided over the die 104, where the IHS structure 110 is coupled to the die 104 using the TIM layer 108. As discussed above, the IHS structure 110 includes the plurality of microchannels 112 and the micromixer chamber 116, that together provide the first closed-loop microchannel structure 114A and the second closed-loop microchannel structure 114B, through which a liquid coolant is configured to flow. As discussed, the first closed-loop microchannel structure 114A and the second closed-loop microchannel structure 114B are fluidly coupled to the micromixer chamber 116 by the first inlet 118 (hot inlet) and the second inlet 120 (cold inlet), respectively. In addition, the first closed-loop microchannel structure 114A and the second closed-loop microchannel structure 114B are fluidly coupled to the micromixer chamber 116 by the outlet 122. The second closed-loop microchannel structure 114B, as previously noted, is disposed further away from the die 104 than the first closed-loop microchannel structure 114A. The first pump 124 (coupled to the first inlet 118) is used to control the liquid injected into the micromixer chamber 116 via the first inlet 118, and the second pump 126 (coupled to the second inlet 120) is used to control the liquid injected into the micromixer chamber 116 via the second inlet 120.

The method 1300 proceeds to block 1304 where a liquid (e.g., water, a magnetic fluid, or other working fluid), having traveled through the first closed-loop microchannel structure 114A, is injected into the micromixer chamber 116 via the first inlet 118 (e.g., while no liquid is injected via the second inlet 120). With reference to FIG. 2A, in an embodiment of the block 1304, the liquid may be injected into the micromixer chamber 116 via the first inlet 118 at a first velocity V1. A first control pulse (e.g., provided by the OIP controller) used to control the first pump 124 to inject the liquid into the micromixer chamber 116 via the first inlet 118 may have a first height H1 (corresponding to the first velocity V1), and the first control pulse may have a first pulse width corresponding to a first time duration T1.

The method 1300 proceeds to block 1306 where the liquid, having traveled through the second closed-loop microchannel structure 114B, is injected into the micromixer chamber 116 via the second inlet 120 (e.g., while no liquid is injected via the first inlet 118). Still with reference to FIG. 2A, in an embodiment of the block 1306, the liquid may be injected into the micromixer chamber 116 via the second inlet 120 at the first velocity V1. A second control pulse (e.g., provided by the OIP controller) used to control the second pump 126 to inject the liquid into the micromixer chamber 116 via the second inlet 120 may have a second height H2 (substantially equal to the first height H1, and corresponding to the first velocity V1), and the second control pulse may have a second pulse width corresponding to a second time duration T2 (substantially equal to the first time duration T1 of the first control pulse).

In the present example, the liquid is injected via each of the first and second inlets 118, 120 at substantially the same velocity (the first velocity V1) while being phase shifted (in time) from each other so that only one of the first and second inlets 118, 120 is injecting liquid into the micromixer chamber 116 at any given time. In other words, the liquid may be injected at different times via each of the first and second inlets 118, 120. In at least some alternative embodiments, liquid may be injected into the micromixer chamber 116 via each of the first and second inlets 118, 120 at the same time or at partially overlapping times. Also, in some cases, the liquid injected via each of the first and second inlets 118, 120 may have different velocities. In other cases, different amounts of liquid may be injected via each of the first and second inlets 118, 120 (e.g., by controlling the first and second pulse widths corresponding to respective ones of the first and second control pulses).

In some embodiments and after the block 1306, the method 1300 then returns to block 1304 where the liquid is again injected into the micromixer chamber 116 via the first inlet 118 (e.g., while no liquid is injected via the second inlet 120), and then proceeds again to block 1306 where the liquid is injected into the micromixer chamber 116 via the second inlet 120 (e.g., while no liquid is injected via the first inlet 118). In some cases, the cycle of blocks 1304-1306 may continue to repeat for as long as the die 104 is operational (e.g., receiving power), for as long as the die 104 is operating at a temperature above a given threshold temperature (e.g., as determined by a local temperature sensor), or for as long as otherwise needed or desired. In some examples, while the cycle of blocks 1304-1306 may continue, parameters of the first and second control pulses may change between cycles (or during a given cycle). For instance, one or more subsequent cycles of blocks 1304-1306 may change the pulse height (and thus the velocity of the injected liquid) and/or the pulse width (and thus an amount of liquid injected).

In an alternative embodiment of the method 1300, at block 1304 and with reference to FIG. 2B, the liquid may be injected into the micromixer chamber 116 via the first inlet 118 at a first velocity V2. A first control pulse (e.g., provided by the OIP controller) used to control the first pump 124 to inject the liquid into the micromixer chamber 116 via the first inlet 118 may have a first height H3 (corresponding to the first velocity V2), and the first control pulse may have a first pulse width corresponding to a first time duration T3.

In the alternative embodiment of the method 1300, at block 1306 and still with reference to FIG. 2B, the liquid may be injected into the micromixer chamber 116 via the second inlet 120 at the first velocity V2. A second control pulse (e.g., provided by the OIP controller) used to control the second pump 126 to inject the liquid into the micromixer chamber 116 via the second inlet 120 may have a second height H4 (substantially equal to the first height H3, and corresponding to the first velocity V2), and the second control pulse may have a second pulse width corresponding to a second time duration T4 (substantially equal to the first time duration T3 of the first control pulse).

In the alternative embodiment of the method 1300 and after the block 1306, the method 1300 then returns to repeat the cycle of blocks 1304-1306. However, in the subsequent iteration of the blocks 1304-1306, the pulse heights (and thus the velocity of the liquid injected into the micromixer chamber) for each of the first and second control pulses may be changed. For example, in the subsequent cycle of block 1304 and again with reference to FIG. 2B, the liquid may be injected into the micromixer chamber 116 via the first inlet 118 at a second velocity V3 different than the first velocity V2. The first control pulse (e.g., provided by the OIP controller) used to control the first pump 124 to inject the liquid into the micromixer chamber 116 via the first inlet 118 may have a third height H5 (corresponding to the second velocity V3), and the first control pulse may have a third pulse width corresponding to a third time duration T5

(substantially equal to the first and second time durations T3, T4). Thereafter, in the subsequent cycle of block 1306 and still referring to FIG. 2B, the liquid may be injected into the micromixer chamber 116 via the second inlet 120 at the second velocity V3. The second control pulse (e.g., provided by the OIP controller) used to control the second pump 126 to inject the liquid into the micromixer chamber 116 via the second inlet 120 may have a fourth height H6 (substantially equal to the third height H5, and corresponding to the second velocity V3), and the second control pulse may have a fourth pulse width corresponding to a fourth time duration T6 (substantially equal to the first, second, and third time durations T3, T4, T5).

In some cases and in the alternative embodiment of the method 1300, the cycle of blocks 1304-1306 (where varying pairs of control pulses having matching velocities while being phase shifted (in time) from each other so that only one of the first and second inlets 118, 120 is injecting liquid into the micromixer chamber 116 at any given time) may continue to repeat for as long as the die 104 is operational (e.g., receiving power), for as long as the die 104 is operating at a temperature above a given threshold temperature (e.g., as determined by the local temperature sensor), or for as long as otherwise needed or desired. Generally, and as previously noted, while the cycle of blocks 1304-1306 may continue, parameters of the first and second control pulses may change between cycles (or during a given cycle). For instance, one or more subsequent cycles of blocks 1304-1306 may change the pulse height (and thus the velocity of the injected liquid) and/or the pulse width (and thus an amount of liquid injected).

The various embodiments described herein thus offer several advantages over the existing art. It will be understood that not all advantages have been necessarily discussed herein, no particular advantage is required for all embodiments, and other embodiments may offer different advantages. As one example, embodiments discussed herein include an IHS structure, and related methods, that support thermal cooling of IC dies and packages and that effectively serve to overcome various shortcomings of existing methods. In some embodiments, the IHS structure includes a plurality of closed loop microchannels coupled to a hybrid active-passive micromixer chamber to increase thermal exchange efficiency of the IHS structure for high performance computing package products. The IHS structure may be disposed over a die or die package, with a TIM layer disposed between the IHS structure and the die or die package. The IHS structure may include a first microchannel adjacent to the die or die package and a second microchannel disposed over the first microchannel, the second microchannel being further away from the die or die package than the first microchannel. In various embodiments, a micromixer chamber is fluidly coupled to the first and second microchannels via respective inlets and an outlet. The inlets for the first and second microchannels may be coupled to pumps, which may be controlled using an OIP control. The OIP control provides for control of a liquid injected into the micromixer chamber (e.g., by controlling liquid velocity and phase (in time)). The micromixer chamber and microchannel inlets may have various designs, each of which may provide a different thermal exchange efficiency to accommodate different heat sinks, different die, or different die packages. Regardless of the particular design of the IHS structure, and regardless of the liquid used as a coolant in the IHS structure, embodiments of the present disclosure provide for improved thermal cooling of IC dies and packages, thereby directly addressing the IC thermal management challenge associated with advanced IC circuits and devices. Additional benefits and/or other advantages will become apparent to those skilled in the art having benefit of the present disclosure.

Thus, one of the embodiments of the present disclosure described an apparatus including an integrated circuit die and an integrated heat sink structure disposed over the integrated circuit die. In some embodiments, the integrated heat sink structure includes a first closed-loop microchannel structure adjacent to the integrated circuit die and a second closed-loop microchannel structure disposed over the first closed-loop microchannel structure. In an example, the second closed-loop microchannel structure is disposed further away from the integrated circuit die than the first closed-loop microchannel structure. In some implementations, a plurality of microchannels and a micromixer chamber collectively provide the first and second closed-loop microchannel structures.

In another of the embodiments, discussed is an integrated circuit (IC) structure including a die and an integrated heat sink disposed over the die. In some examples, the integrated heat sink includes a plurality of closed-loop microchannel structures and a first micromixer chamber. In some cases, the plurality of closed-loop microchannel structures is fluidly coupled to the first micromixer chamber by first respective inlets, and the plurality of closed-loop microchannel structures is fluidly coupled to the first micromixer chamber by a first common outlet. In some embodiments, each of the first respective inlets includes a pump configured to control a liquid injected into the first micromixer chamber via the first respective inlets.

In yet another of the embodiments, discussed is a method including providing an integrated heat sink over a die. In some embodiments, the integrated heat sink includes a first closed-loop microchannel structure fluidly coupled to a micromixer chamber by a first inlet and a second closed-loop microchannel structure fluidly coupled to the micromixer chamber by a second inlet. In some examples, a first pump is coupled to the first inlet and a second pump is coupled to the second inlet. In some implementations, the method further includes injecting, via the first inlet and at a first velocity, a liquid into the micromixer chamber. In some embodiments, the method further includes injecting, via the second inlet and at a second velocity, the liquid into the micromixer chamber.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An integrated circuit (IC) structure, comprising:

a substrate including a device layer;

a first thermal interface material layer disposed over the substrate;

a first closed-loop microchannel structure disposed over the thermal interface material layer and a first distance away from the substrate, wherein the first closed-loop microchannel structure is fluidly coupled to a micromixer chamber via a first inlet and a common outlet; and a second closed-loop microchannel structure disposed over the first closed-loop microchannel structure and a second distance away from the substrate, wherein the second distance is greater than the first distance, and wherein the second closed-loop microchannel structure is fluidly coupled to the micromixer chamber via a second inlet and the common outlet.

2. The IC structure of claim 1, further including a first pump coupled to the first inlet and a second pump coupled to the second inlet.

3. The IC structure of claim 2, wherein at least one of the first and second pumps includes an electro-hydrodynamic (EHD) pump.

4. The IC structure of claim 2, further including an active oscillate input phase (OIP) controller configured to control the first and second pumps.

5. The IC structure of claim 1, wherein the device layer includes at least one heat-generating device.

6. The IC structure of claim 1, further including a liquid disposed within the first and second closed-loop microchannel structures.

7. The IC structure of claim 6, wherein the liquid includes at least one of water, a magnetic fluid, and a dielectric fluid.

8. The IC structure of claim 1, wherein a plurality of microchannels and the micromixer chamber collectively provide the first and second closed-loop microchannel structures, and wherein at least one of a length, a width, and a height of the plurality of microchannels is greater than 100 microns.

9. The IC structure of claim 1, wherein the second closed-loop microchannel structure is further fluidly coupled to the micromixer chamber via a third inlet.

10. The IC structure of claim 1, further comprising a second thermal interface material layer disposed over the second closed-loop microchannel structure and an external heat sink disposed over the second thermal interface material layer.

11. An integrated circuit (IC) cooling assembly, comprising:

a substrate;

a die disposed over the substrate, wherein the die has a first surface area; and an integrated heat sink structure disposed over the die, wherein the integrated heat sink structure has a second surface area larger than the first surface area; and wherein the integrated heat sink structure includes a plurality of integrated heat sink devices, wherein each of the plurality of integrated heat sink devices includes at least a first closed-loop microchannel structure in a bottom portion of the integrated heat sink structure and a second closed-loop microchannel structure in a top portion of the integrated heat sink structure, and wherein the first and second closed-loop microchannel structures are fluidly coupled to a micromixer chamber by respective inlets and an outlet.

12. The IC cooling assembly of claim 11, further comprising stiffeners coupled between lateral ends of a bottom surface of the integrated heat sink structure and a top surface of the substrate.

13. The IC cooling assembly of claim 11, further comprising a first thermal interface material layer interposing the die and the integrated heat sink structure.

14. The IC cooling assembly of claim 11, further comprising a second thermal interface material layer disposed over the integrated heat sink structure and an external heat sink disposed over the second thermal interface material layer.

15. The IC cooling assembly of claim 11, wherein the plurality of integrated heat sink devices includes a 3×3 array of integrated heat sink devices, a 4×4 array of integrated heat sink devices, or a 5×5 array of integrated heat sink devices, in a top-down view.

16. The IC cooling assembly of claim 11, further comprising a printed circuit board (PCB), wherein a bottom surface of the substrate is coupled to a top surface of the PCB, wherein the integrated heat sink structure further includes a power/control circuit electrically connected to the PCB.

17. The IC cooling assembly of claim 16, further comprising a pump coupled to each of the respective inlets, wherein the power/control circuit is configured to control and provide power to the pump.

18. A method, comprising:

providing an integrated heat sink structure over a substrate, wherein the integrated heat sink structure includes a first closed-loop microchannel structure in a bottom part of the integrated heat sink structure and a second closed-loop microchannel structure in a top part of the integrated heat sink structure, and wherein the first and second closed-loop microchannel structures are fluidly coupled to a micromixer chamber by respective first and second inlets; and injecting, by respective first and second pumps coupled to respective ones of the first and second inlets, a working fluid into the micromixer chamber;

wherein a first control pulse, having a first height, controls the first pump;

wherein a second control pulse, having a second height, controls the second pump; and wherein the first and second heights correspond to respective first and second velocities at which the working fluid is injected into the micromixer chamber via respective ones of the first and second inlets.

19. The method of claim 18, wherein the first control pulse and the second control pulse are phase shifted from each other.

20. The method of claim 18, wherein at least one of the first height and the second height of respective ones of the first and second control pulses is changed between injection cycles.

* * * * *